United States Patent
Begley et al.

(10) Patent No.: US 7,662,485 B2
(45) Date of Patent: *Feb. 16, 2010

(54) WHITE ORGANIC LIGHT-EMITTING DEVICES WITH IMPROVED PERFORMANCE

(75) Inventors: William J. Begley, Webster, NY (US); Tukaram K. Hatwar, Penfield, NY (US); Manju Rajeswaran, Fairport, NY (US); Natasha Andrievsky, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 1039 days.

This patent is subject to a terminal disclaimer.

(21) Appl. No.: 10/801,997

(22) Filed: Mar. 16, 2004

(65) Prior Publication Data

US 2005/0208327 A1    Sep. 22, 2005

(51) Int. Cl.
*H01L 51/54* (2006.01)
(52) U.S. Cl. .......... 428/690; 428/917; 313/504; 313/506
(58) Field of Classification Search ............ 428/690, 428/917, 332; 313/504, 506, 112; 257/98
See application file for complete search history.

(56) References Cited

U.S. PATENT DOCUMENTS

| | | | | |
|---|---|---|---|---|
| 3,701,738 A | * | 10/1972 | Roberts | 252/700 |
| 5,503,910 A | * | 4/1996 | Matsuura et al. | 428/212 |
| 5,640,067 A | * | 6/1997 | Yamauchi et al. | 313/504 |
| 5,989,737 A | | 11/1999 | Xie et al. | |
| 6,285,039 B1 | * | 9/2001 | Kobori et al. | 257/40 |
| 6,627,333 B2 | | 9/2003 | Hatwar | |
| 6,696,177 B1 | | 2/2004 | Hatwar | |
| 6,720,092 B2 | | 4/2004 | Hatwar | |
| 6,875,524 B2 | * | 4/2005 | Hatwar et al. | 428/690 |
| 6,967,062 B2 | * | 11/2005 | Hatwar et al. | 428/690 |
| 7,037,601 B2 | * | 5/2006 | Hatwar | 428/690 |
| 7,288,330 B2 | * | 10/2007 | Hatwar et al. | 428/690 |
| 2003/0193286 A1 | * | 10/2003 | Ottermann et al. | 313/506 |
| 2003/0201415 A1 | * | 10/2003 | Hoag et al. | 251/40 |
| 2004/0001968 A1 | | 1/2004 | Hatwar et al. | |
| 2004/0058193 A1 | * | 3/2004 | Hatwar | 428/690 |
| 2005/0147844 A1 | * | 7/2005 | Hatwar et al. | 428/690 |

FOREIGN PATENT DOCUMENTS

| | | |
|---|---|---|
| EP | 1 405 893 | 4/2004 |
| JP | 04-335087 | * 11/1992 |
| JP | 04-335087 | 8/2001 |
| JP | 2003055652 | * 2/2003 |

* cited by examiner

*Primary Examiner*—Dawn Garrett
(74) *Attorney, Agent, or Firm*—Arthur E. Kluegel; Raymond L. Owens

(57) ABSTRACT

An organic light-emitting diode (OLED) device produces white light, includes a) an anode; b) a hole-transporting layer disposed over the anode; c) a blue light-emitting layer disposed over the hole-transporting layer; d) an electron-transporting layer disposed over the blue light-emitting layer; e) a cathode disposed over the electron-transporting layer; wherein the hole-transporting layer comprises an entire layer or a partial portion of a layer in contact with the blue light-emitting layer and contains a light-emitting naphthacene compound having a specified formula.

2 Claims, 3 Drawing Sheets

WHITE ORGANIC LIGHT-EMITTING DEVICES WITH IMPROVED PERFORMANCE

CROSS REFERENCE TO RELATED APPLICATIONS

Reference is made to commonly assigned U.S. Pat. No. 6,696,177 (Feb. 24, 2004) by Tukaram K. Hatwar, entitled "White Organic Electroluminescent Devices with Improved Stability and Efficiency"; U.S. Pat. No. 6,627,333 (Sep. 30, 2003) by Tukaram K. Hatwar, entitled "White Organic Electroluminescent Devices with Improved Efficiency"; U.S. Ser. No. 10/191,251, filed Jul., 2002 by Tukaram K. Hatwar, entitled "White Organic Light-Emitting Devices Using Rubrene Layer"; U.S. Pat. No. 6,661,023 (Feb. 9, 2003) by Benjamin P. Hoag et al., entitled "Organic Element for Electroluminescent Devices"; U.S. Ser. No. 10/086,067, filed Feb. 28, 2002 by Benjamin P. Hoag et al., entitled "Organic Element for Electroluminescent Devices"; U.S. Ser. No. 10/252,487, filed Jun. 27, 2002 by Lelia Cosimbescu, entitled "Device Containing Green Organic Light-Emitting Diode"; and U.S. Ser. No. 10/693,121, filed Oct. 24, 2003.

FIELD OF THE INVENTION

The present invention relates to organic light-emitting OLED devices which produce white light.

BACKGROUND OF THE INVENTION

An OLED device includes a substrate, an anode, a hole-transporting layer made of an organic compound, an organic luminescent layer with suitable light emitting materials, also known as dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Efficient white light producing OLED devices are considered as low cost alternative for several applications such as paper-thin light sources, backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

The following patents and publications disclose the preparation of organic OLED devices capable of emitting white light, comprising a hole-transporting layer and an organic luminescent layer, and interposed between a pair of electrodes.

White light producing OLED devices have been reported before by J. Shi (U.S. Pat. No. 5,683,823) wherein the luminescent layer includes red and blue light-emitting materials uniformly dispersed in a host emitting material. This device has good electroluminescent characteristics, but the concentration of the red and blue dopants are very small, such as 0.12% and 0.25% of the host material. These concentrations are difficult to control during large-scale manufacturing. Sato et al. in JP 07,142,169 discloses an OLED device, capable of emitting white light, made by placing a blue light-emitting layer next to the hole-transporting layer and followed by a green light-emitting layer having a region containing a red fluorescent layer.

Kido et al., in Science, Vol. 267, p. 1332 (1995) and in APL Vol. 64, p. 815 (1994), report a white light producing OLED device. In this device three emitter layers with different carrier transport properties, each emitting blue, green or red light, are used to generate white light. Littman et al. in U.S. Pat. No. 5,405,709 disclose another white emitting device, which is capable of emitting white light in response to hole-electron recombination, and comprises a fluorescent in a visible light range from bluish green to red. Recently, Deshpande et al., in Applied Physics Letters, Vol. 75, p. 888 (1999), published white OLED device using red, blue, and green luminescent layers separated by a hole blocking layer.

However, these OLED devices require a very small amount of dopant concentrations, making the process difficult to control for large-scale manufacturing. Also, emission color varies due to small changes in the dopant concentration. White OLEDS are used making full-color devices using the color filters. However, the color filter transmits only about 30% of the original light. Therefore, high luminance efficiency and stability are required for the white OLEDs.

SUMMARY OF THE INVENTION

It is an object of the present invention to produce an effective white light-emitting organic device.

It is another object of this invention to provide an efficient and stable white light producing OLED device with simple structure and which can be reproduced in manufacturing environment.

It is a further object of the invention to provide a thermally stable yellow-light emitting material.

It has been found quite unexpectedly that white light producing OLED devices with high luminance efficiency and operational stability can be obtained by doping yellow light emitting rubrene derivatives, also known as yellow dopants, such as 2,8-di-tert-butyl-5,6,11,12-tetra(p-tert-butylphenyl) naphthacene (Inv-1), or 2,8-di-tert-butyl-5,11-di(p-tert-butylphenyl)-6,12-di(p-phenylphenyl)naphthacene (Inv-2), into the NPB hole-transporting layer, and blue light emitting materials, also known as blue dopants, such as distyrylamine or bis(azinyl)amine derivatives, into the TBADN host light-emitting layer. Such yellow-light emitting materials have unexpectedly been found to be thermally stable in the process of producing the OLED device. Dopants or light-emitting materials can be coated into the hole-transporting layer from 0.01 to 50% by weight of the host material, but typically coated from 0.01 to 30% and more typically coated from 0.01 to 15% by weight into the host material.

The object is achieved by an organic light-emitting diode (OLED) device which produces substantially white light, comprising:

a) an anode;

b) a hole-transporting layer disposed over the anode;

c) a blue light-emitting layer doped with a blue light-emitting compound disposed directly on the hole-transporting layer;

d) an electron-transporting layer disposed over the blue light-emitting layer;

e) a cathode disposed over the electron-transporting layer; and f) wherein the hole-transporting layer or electron-transporting layer, or both the hole-transporting layer or electron-transporting layer, being selectively doped with the following compound, of formula (I), or derivatives thereof which emits light in the yellow region of the spectrum and which corre sponds to an entire layer or a partial portion of a layer in contact with the blue light-emitting layer:

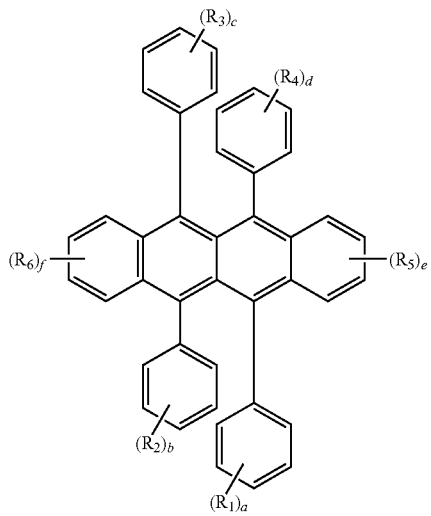

Formula (I)

wherein $R_1$, $R_2$, $R_3$, $R_4$, $R_5$ and $R_6$ represent substituents on each ring where each substituent is individually selected from alkyl or substituted alkyl groups of from 1 to 24 carbon atoms; aryl or substituted aryl groups of from 6 to 20 carbon atoms; carbon atoms from 4 to 24 necessary to complete a fused aromatic ring; heterocyclic or substituted heterocyclic groups of from 5 to 24 carbon atoms, which may be bonded via a single bond, or may complete a fused heteroaromatic ring system; alkoxy or aryloxy groups, alkoxylamino, alkylamino, and arylamino groups of from 1 to 24 carbon atoms; and fluorine, chlorine, bromine or cyano substituents;

a, b, c and d are individually selected from 0 through 5;

e and f are individually selected from 0 through 4;

provided that at least one of $R_1$ through $R_4$ is not a fused ring group and at least one of $R_1$ through $R_6$ is a substituent; and provided further that neither both $R_1$ and $R_4$ nor both $R_2$ and $R_3$ are heterocyclic.

ADVANTAGES

The following are features and advantages of the present invention.

A simplified OLED device for producing white light by having a yellow emitting rubrene derived dopant, 2,8-di-tert-butyl-5,6,11,12-tetra(p-tert-butylphenyl)naphthacene (Inv-1), or 2,8-di-tert-butyl-5,11-di(p-tert-butylphenyl)-6,12-di(p-phenylphenyl)naphthacene (Inv-2) in the hole-transporting layer, or the electron-transporting layer, or both.

High efficiency white OLEDs can be used to fabricate full-color devices using the substrate with the on chip color filters and integrated thin film transistors.

OLED devices made in accordance with the present invention eliminate the need for using shadow mask for making light-emitting layers in full-color OLED devices.

OLED devices made in accordance with the present invention can be produced with high reproducibility and consistently to provide high light efficiency.

These devices have high operational stability and also require low drive voltage.

The invention also provides a display including such a device and a method of imaging using such a device.

Such a device exhibits long wavelength electroluminescence desirable in the production of high purity white light.

The materials of the invention are thermally stable, thus allowing them to be used in the manufacture of OLED devices, which requires the materials to be heated over prolonged periods and at high temperatures.

DETAILED DESCRIPTION OF THE INVENTION

Figure 1:
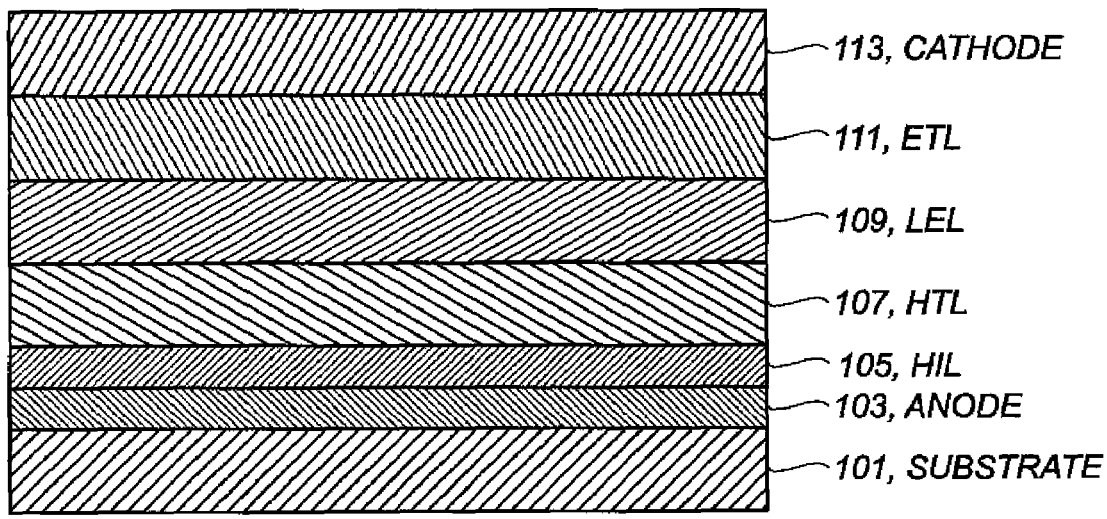
FIG. 1 depicts a white light producing EL device wherein the hole-transporting layer includes a light-emitting material.

The invention is summarized above. A conventional light-emitting layer of the organic OLED device comprises a luminescent or fluorescent material where electroluminescence (EL) is produced as a result of electron-hole pair recombination.

The white OLED emission can be used to prepare a full-color device using red, green, and blue (RGB) color filters. The RGB filters may be deposited on the substrate (when light transmission is through the substrate), incorporated into the substrate, or deposited over the top electrode (when light transmission is through the top electrode). When depositing a RGB filter array over the top electrode, a buffer layer of appropriate thickness, for example from 1 to 1000 nm, may be used to protect the top electrode. The buffer layer may comprise inorganic materials, for example, silicon oxides and nitrides, or organic materials, for example, polymers, or multiple layers of inorganic and organic materials. Methods for providing RGB filter arrays are well known in the art. Lithographic means, inkjet printing, and laser thermal transfer are just a few of the methods RGB filters may be provided.

This technique of producing of full-color display using white light plus RGB filters has several advantages over the precision shadow masking technology used for producing the full-colors. This technique does not require precision alignment, is low cost and easy to manufacture. The substrate itself contains thin film transistors to address the individual pixels. U.S. Pat. Nos. 5,550,066 and 5,684,365 to Ching and Hseih describe the addressing methods of the TFT substrates.

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. Additionally, the hole-transporting layer may be constructed of one or more layers such that each layer can be doped or un-doped with the same or different light emitting material. It should also be understood that the hole-transporting layer can be co-doped with other stabilizing dopants such as t-BuDPN along with naphthacene derivatives of this invention. Similarly, the blue emitting layer can consist of co-dopants such as NPB, a hue modifier for the blue emitting layer, along with blue emitting dopants. The concentration of these co-dopants is in the range from 0.5 to 30% and preferably between 5 to 20%.

Materials for use as yellow-light emitters or dopants in the hole-transporting or electron-transporting layers are those represented by Formula (I).

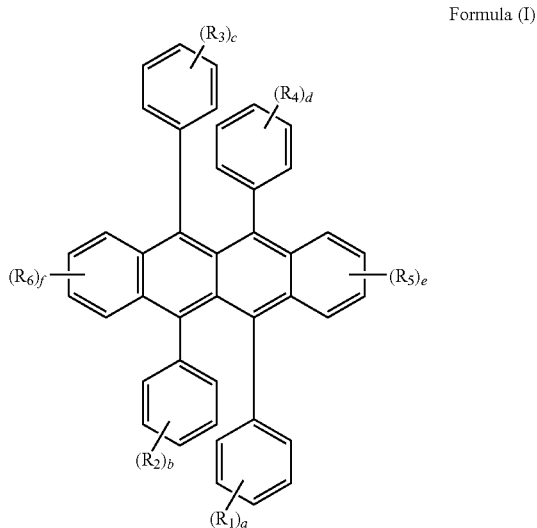

Formula (I)

wherein $R_1$, $R_2$, $R_3$, $R_4$, $R_5$ and $R_6$ represent substituents on each ring where each substituent is individually selected from alkyl or substituted alkyl groups of from 1 to 24 carbon atoms; aryl or substituted aryl groups of from 6 to 20 carbon atoms; carbon atoms from 4 to 24 necessary to complete a fused aromatic ring; heterocyclic or substituted heterocyclic groups of from 5 to 24 carbon atoms, which may be bonded via a single bond, or may complete a fused heteroaromatic ring system; alkoxy or aryloxy groups, alkoxylamino, alkylamino, and arylamino groups of from 1 to 24 carbon atoms; and fluorine, chlorine, bromine or cyano substituents;

a, b, c and d are individually selected from 0 through 5;

e and f are individually selected from 0 through 4;

provided that at least one of $R_1$ through $R_4$ is not a fused ring group and at least one of $R_1$ through $R_6$ is a substituent; and provided further that neither both $R_1$ and $R_4$ nor both $R_2$ and $R_3$ are heterocyclic.

Useful embodiments of the invention are those wherein:

a) at least one of $R_5$ and $R_6$ are selected from aromatic or heterocyclic groups; and b) at least one of $R_1$, $R_2$, $R_3$, and $R_4$ contain at least one substituent identical to the aromatic or heterocyclic groups in paragraph a).

Embodiments wherein the naphthacene is represented by formula (II) are also useful in the invention:

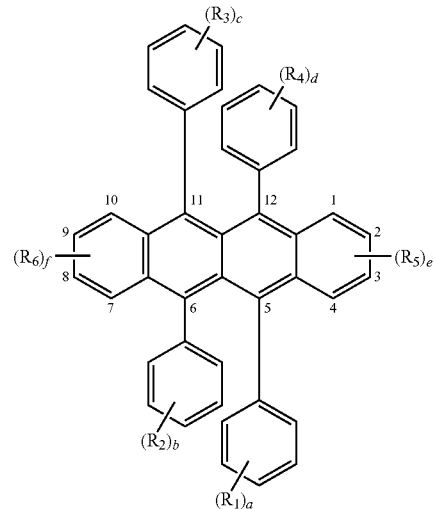

Formula (II)

wherein:

a) there are identical aromatic or heterocyclic groups at the 2- and 8-positions;

b) the phenyl rings in the 5- and 11-positions contain para-substituents identical to the aromatic or heterocyclic groups in paragraph a); and c) the phenyl rings in the 6- and 12-positions are substituted or not.

Other embodiments of the invention incorporating the yellow emitting material of formula (I) arise when:

a) at least one of $R_5$ and $R_6$ are selected from oxy, aza and thio groups; and b) at least one of $R_1$, $R_2$, $R_3$, and $R_4$ contain one substituent identical to the oxy, aza and thio groups in paragraph a).

Specific embodiments of the invention are represented by formula (II) wherein:

a) $R_5$ and $R_6$ include identical oxy, aza or thio groups at the 2- and 8-positions;

b) the phenyl rings in the 5- and 1'-positions contain para-substituents identical to the oxy, aza or thio groups in paragraph a);

c) the phenyl rings in the 6- and 12-positions are substituted or not; and provided that when a single substituent is present on both phenyl rings in paragraph c), said substituent is not a methoxy group located at the para-position.

One preferred embodiment of the invention incorporating alkyl or non-aromatic carbocyclic groups is represented by formula (II) wherein:

a) $R_5$ and $R_6$ each contain at least one identical alkyl or non-aromatic carbocyclic group; and b) $R_1$ and $R_3$ each contain at least one substituent identical to the alkyl or non-aromatic carbocyclic groups in paragraph a).

Embodiments of the invention wherein the alkyl or non-aromatic carbocyclic groups are located at specific locations on the naphthacene of formula (II) are those wherein:

a) $R_5$ and $R_6$ each contain at least one identical branched alkyl or non-aromatic carbocyclic group at the 2- and 8-positions;

b) the phenyl rings in the 5- and 11-positions contain para-substituents identical to the branched alkyl or non-aromatic carbocyclic groups in paragraph a); and c) the phenyl rings in the 6- and 12-positions are substituted or not.

Examples of useful heterocyclic groups are benzimidazolyl, benzoselenazolyl, benzothiazolyl, benzoxazolyl, chromonyl, furyl, imidazolyl, indazolyl, indolyl, isoquinolyl, isothiazolyl, isoxazolyl, morpholinyl, oxadiazolyl, oxazolyl, picolinyl, piperidinyl, purinyl, pyradazinyl, pyranyl, pyrazinyl, pyrazolyl, pyridyl, pyrimidinyl, pyrrolyl, pyrrolidinyl, quinaldinyl, quinazolinyl, quinolyl, quinoxalinyl, selenazoyl, tellurazolyl, tetrazolyl, tetrahydrofuryl, thiadiazolyl, thiamorpholinyl, thiatriazolyl, thiazolyl, thienyl, thiophenyl, and triazolyl groups. Particularly useful heterocyclic groups are thiazolyl, furyl, thienyl, pyridyl and quinolinyl groups, which may be bonded via a single bond, or may complete a fused heteroaromatic ring system.

Particularly useful aryl or fused aromatic ring groups are phenyl, naphthyl, anthracenyl, phenanthryl, pyrenyl, or perylenyl groups.

Another embodiment of the invention is an organic light-emitting diode (OLED) device that produces white light, including:

a) an anode;

b) a hole-transporting layer disposed over the anode;

c) a blue light-emitting layer disposed over the hole-transporting layer;

d) an electron-transporting layer disposed over the blue light-emitting layer;

e) a cathode disposed over the electron-transporting layer; and f) wherein the hole-transporting layer comprises an entire layer or a partial portion of a layer in contact with the blue light-emitting layer and contains a light-emitting naphthacene compound having formula (III)

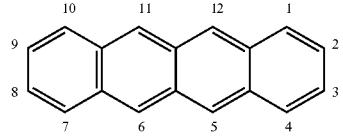

Formula (III)

wherein:

i) said naphthacene contains at least one fluorine or fluorine containing group; and ii) when exactly two fluorine containing groups are present said groups are not located each at the 5- and 12-positions nor each at the 6- and 11-positions.

Useful naphthacene derivatives of formula (III) of the invention are dopants that have either sublimation temperatures lower by at least 5° C. to 20° C. than the naphthacene derivative without fluorine or fluorine-containing groups, or they sublime, whereas the derivative without the fluorine or fluorine containing groups melts. Lower sublimation temperatures reduce the possibility that the dopants will decompose. Lower quality devices result when dopants melt before they are deposited on the device. Useful embodiments of formula (III), with fluorine or fluorine-containing groups are those wherein, either a) the sublimation temperature of said naphthacene derivative is lower by at least 5° C. than the derivative without fluorine or fluorine containing groups; or b) the naphthacene derivative sublimes and the derivative without the fluorine or fluorine containing groups melts.

Embodiments of the invention wherein the fluorine or fluorine-containing groups are located at specific locations on the naphthacene of formula (II) are those wherein:

a) said naphthacene contains at least one fluorine or fluorine containing group on the phenyl groups located at positions 5, 6, 11, and 12 or at positions 1 through 4 or at positions 7 through 10; and b) when exactly two fluorines are present said groups are not located each on the 5- and 12-positioned phenyls nor each on the 6- and 11-positioned phenyls.

Preferred embodiments of the invention wherein there are branched alkyl groups at positions 2 and 8 of formula (II) are shown below in formulae (IV) and (V):

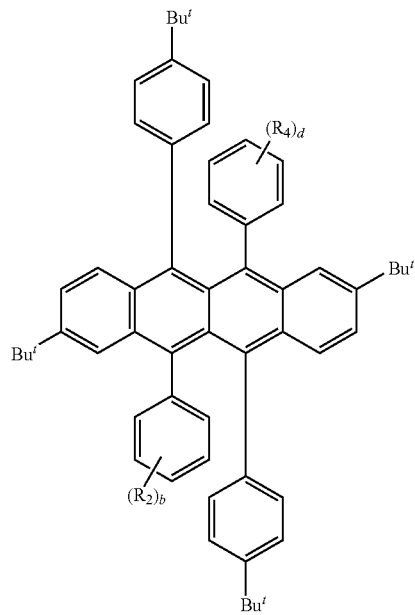

Formula (IV)

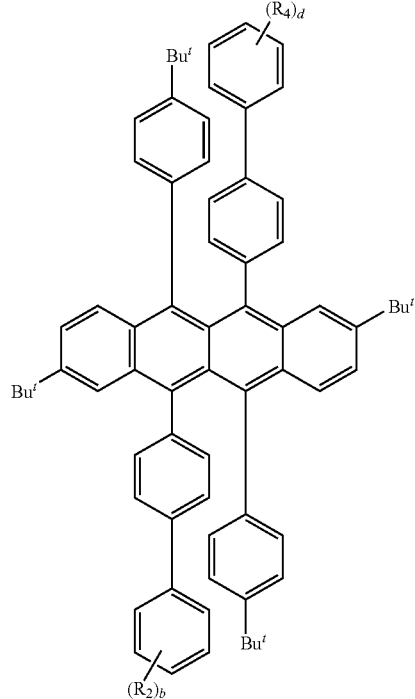

Formula (V)

Specific examples of the invention are as follows:
Inv-1
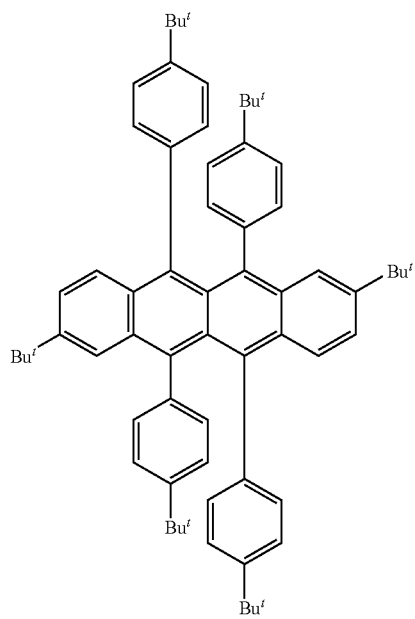
Inv-3
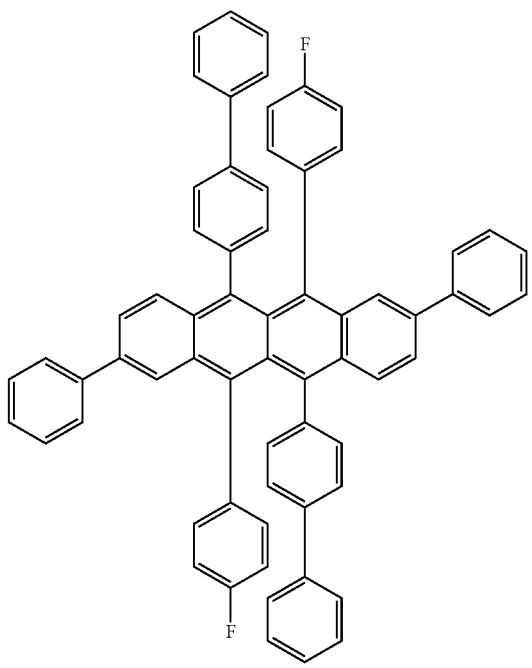
Inv-2
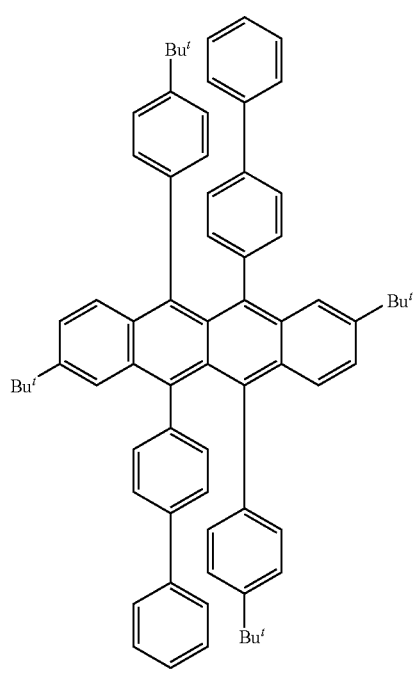
Inv-4
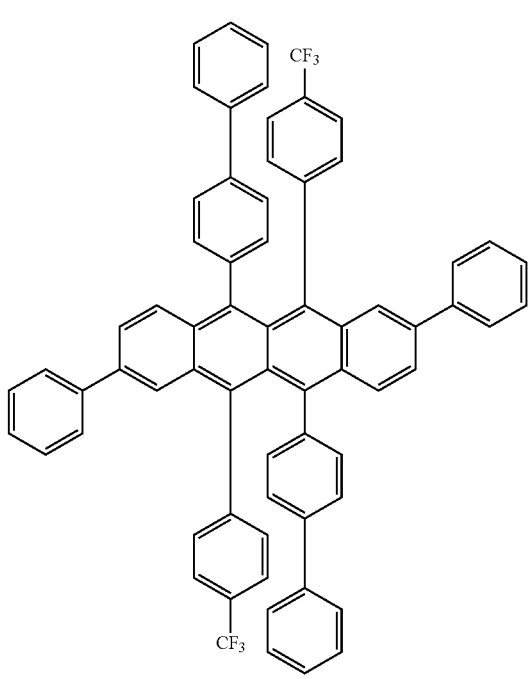

-continued
Inv-5
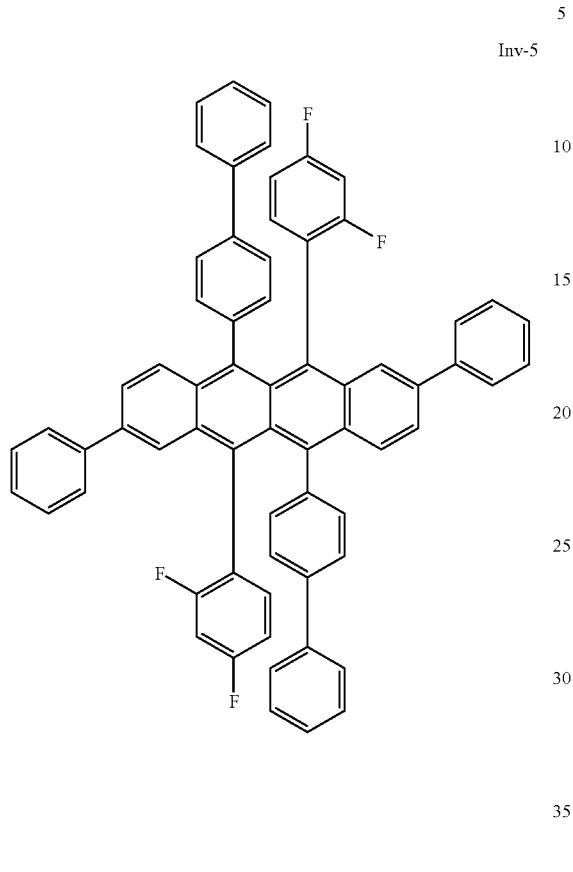
Inv-7
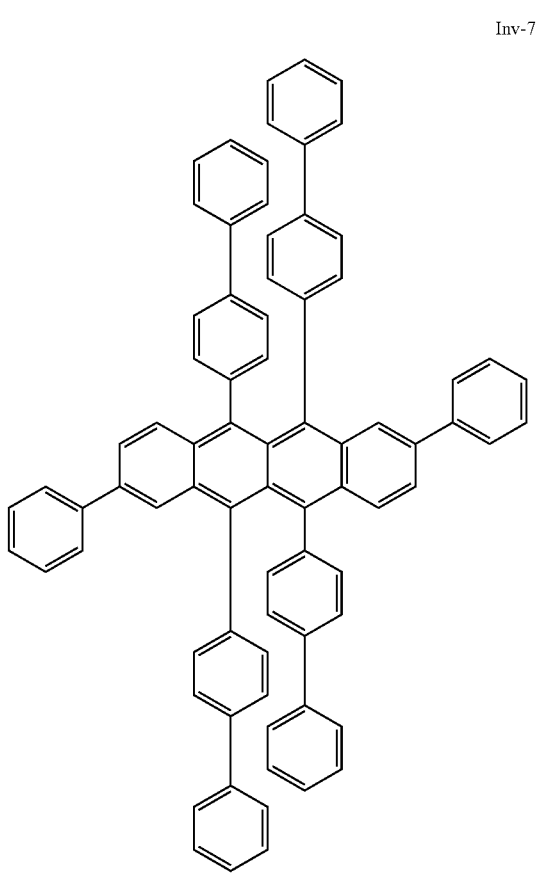
Inv-6
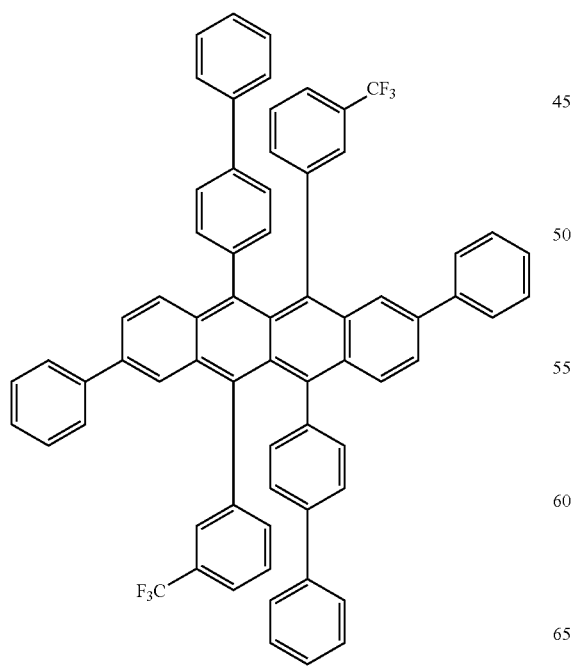
Inv-8
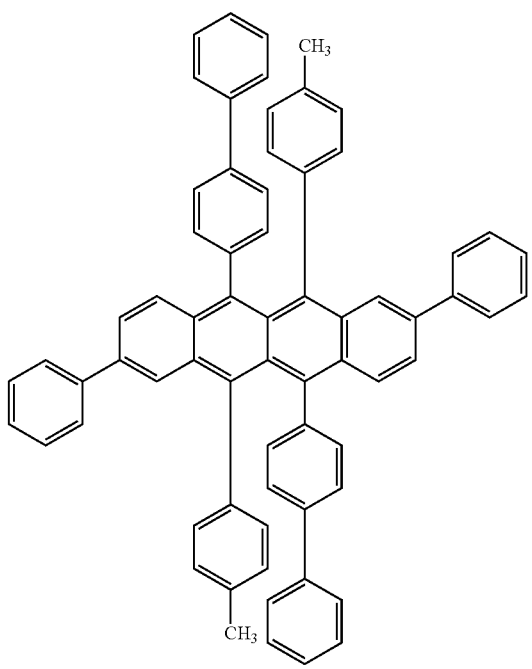

-continued
Inv-9
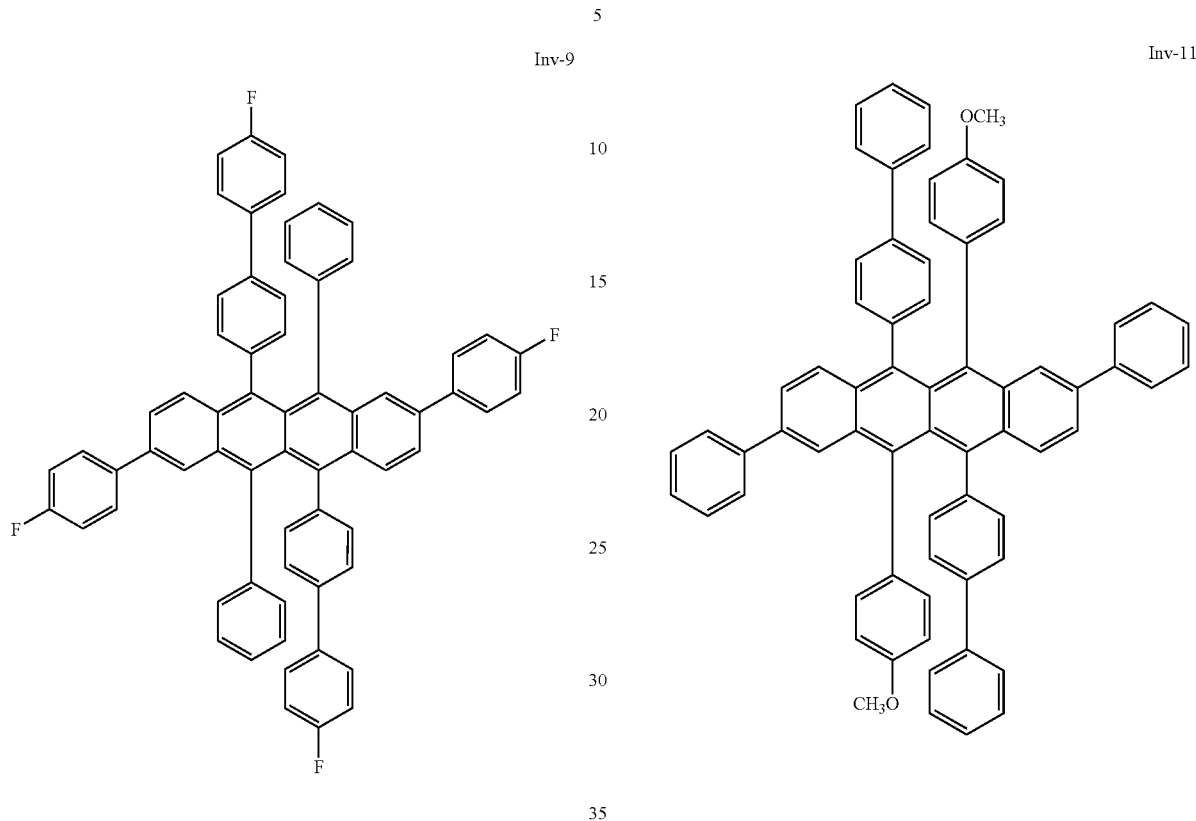
Inv-11
Inv-10
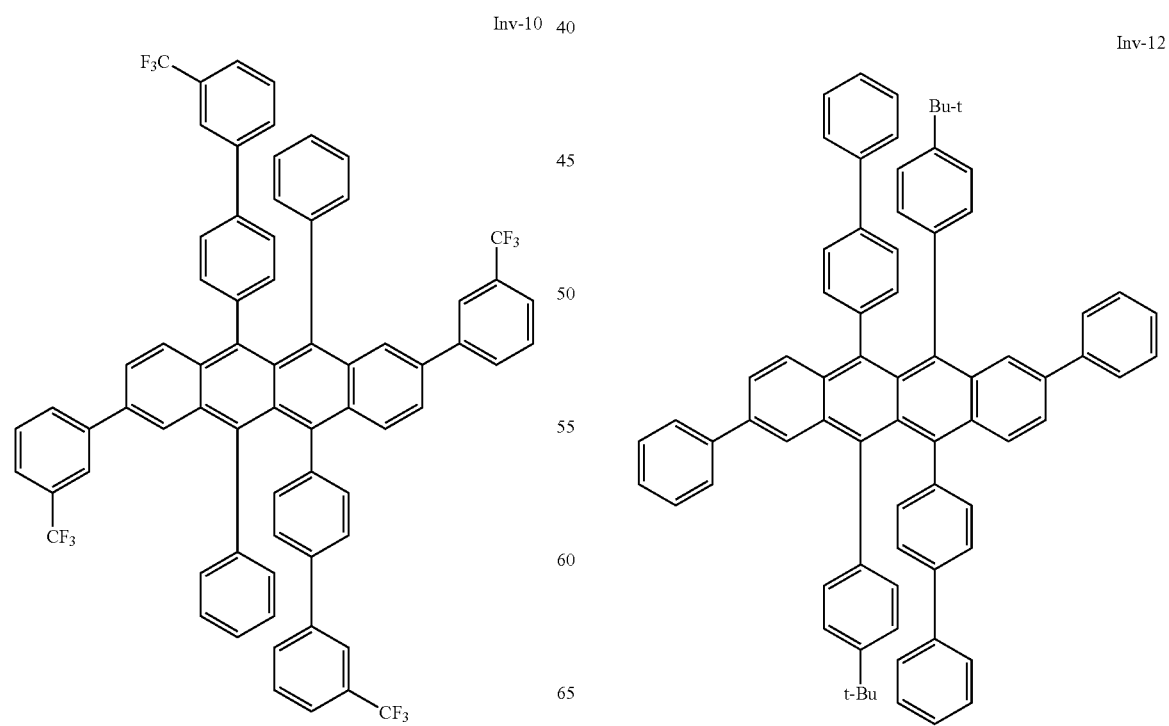
Inv-12

Inv-13
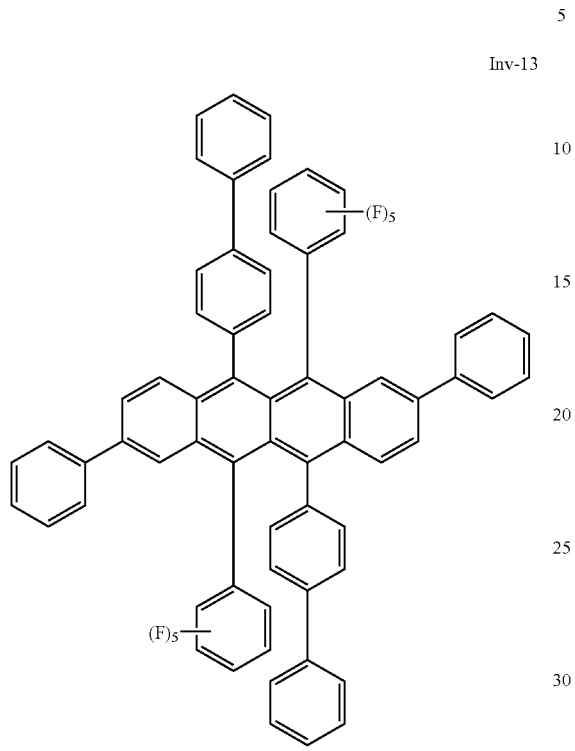
Inv-14
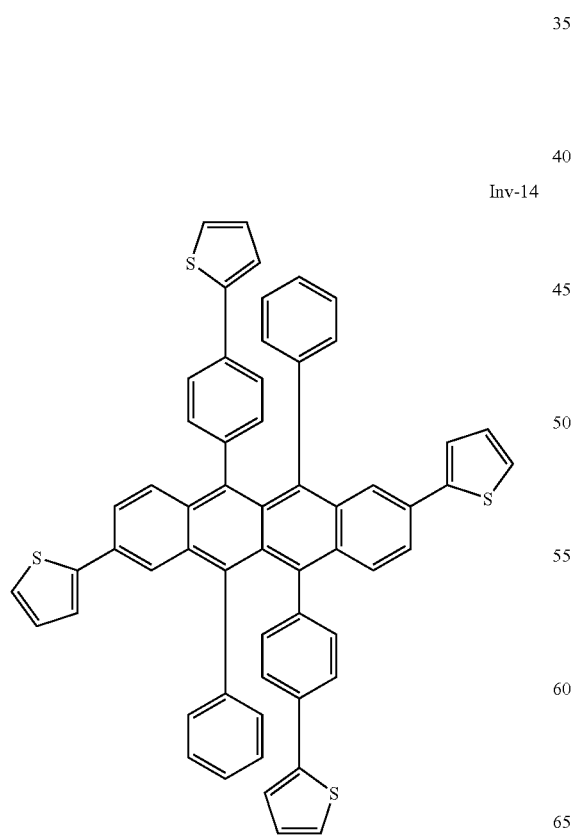
Inv-15
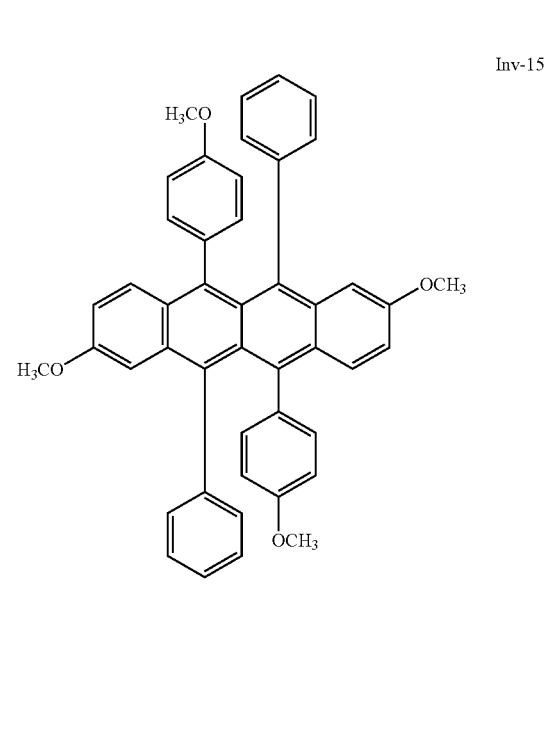
Inv-16
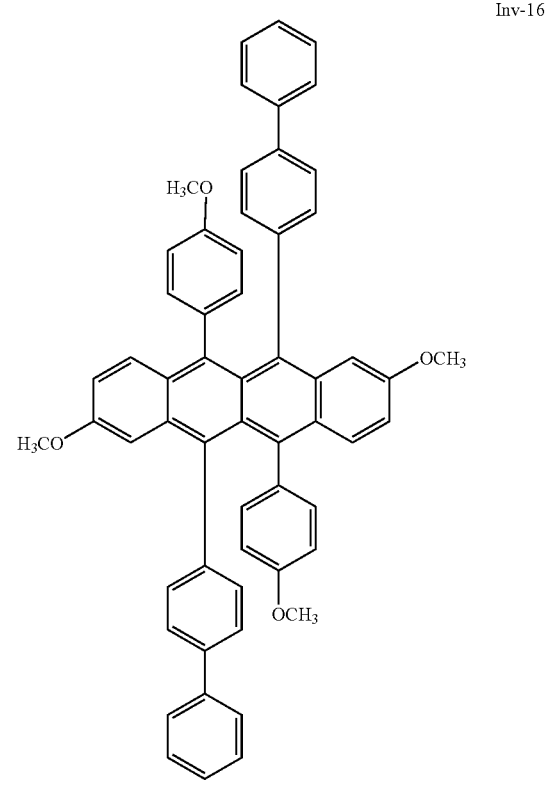

-continued
Inv-17
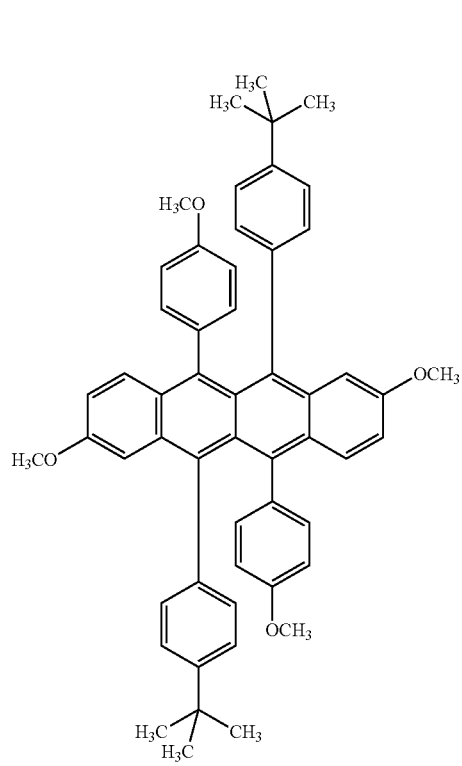
Inv-18
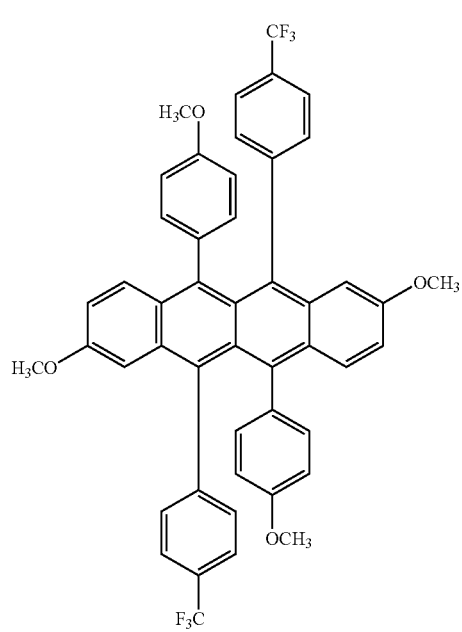
-continued
Inv-19
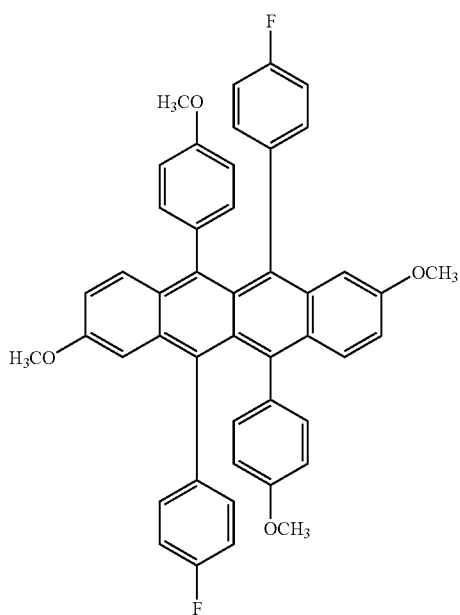
Inv-20
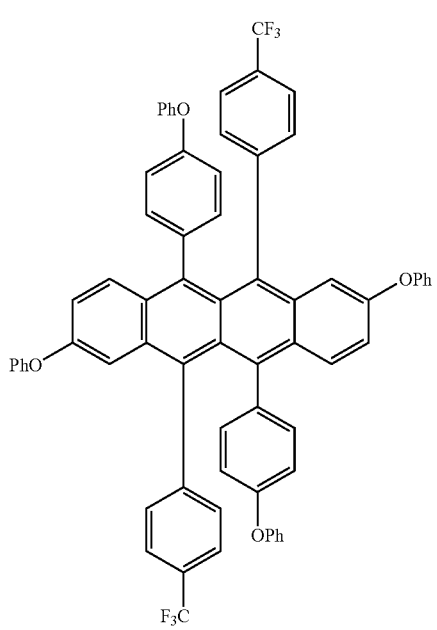

Inv-21
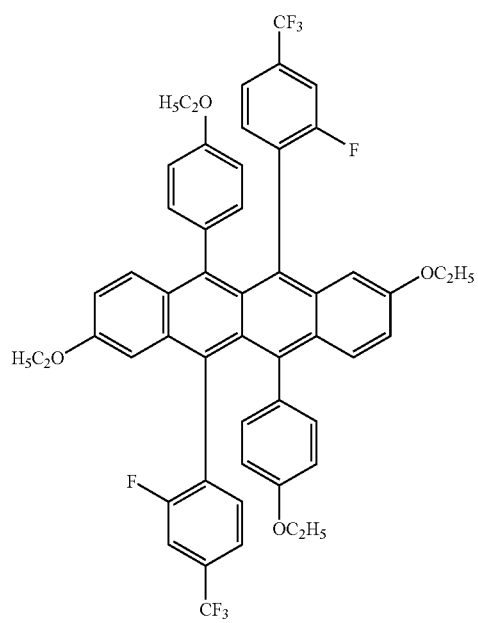
Inv-22
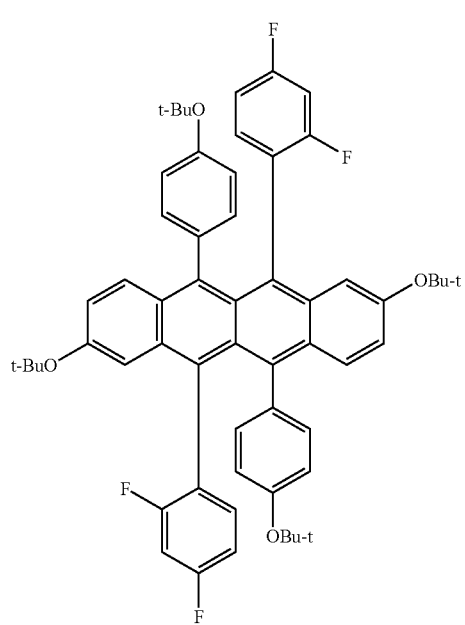
Inv-23
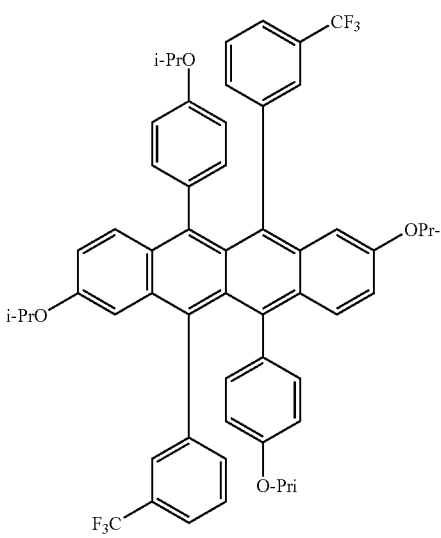
Inv-24
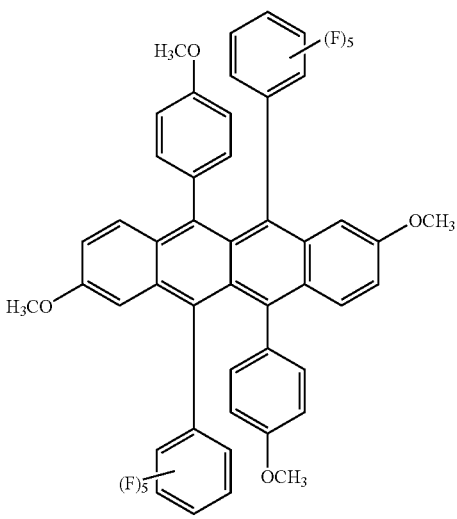

Inv-25
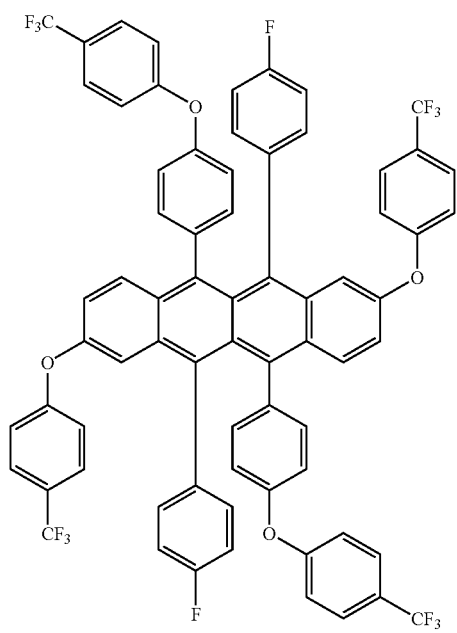
Inv-27
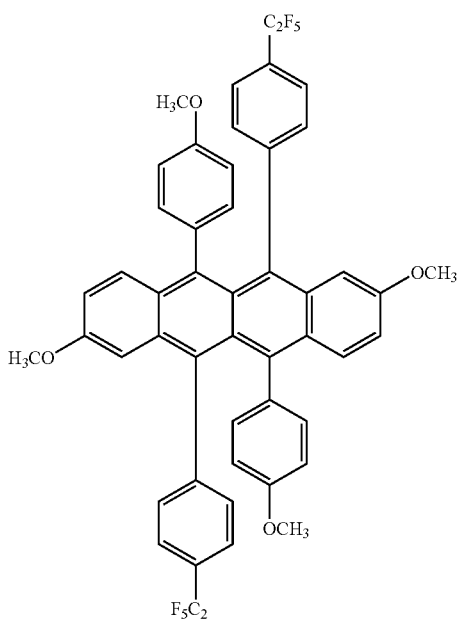
Inv-26
Inv-28
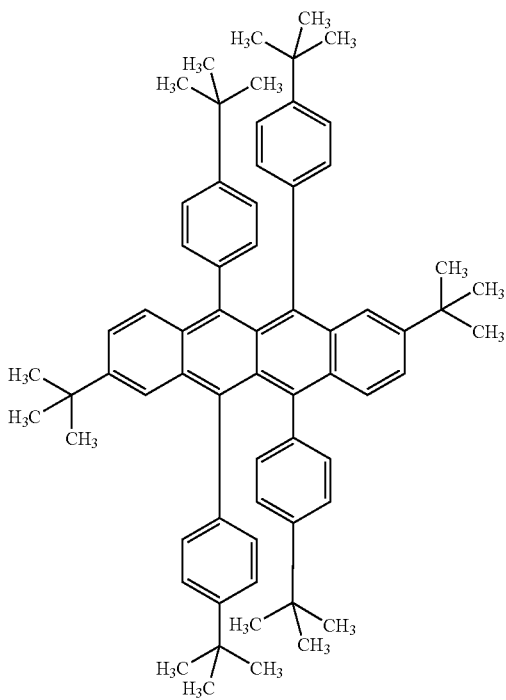

Inv-29
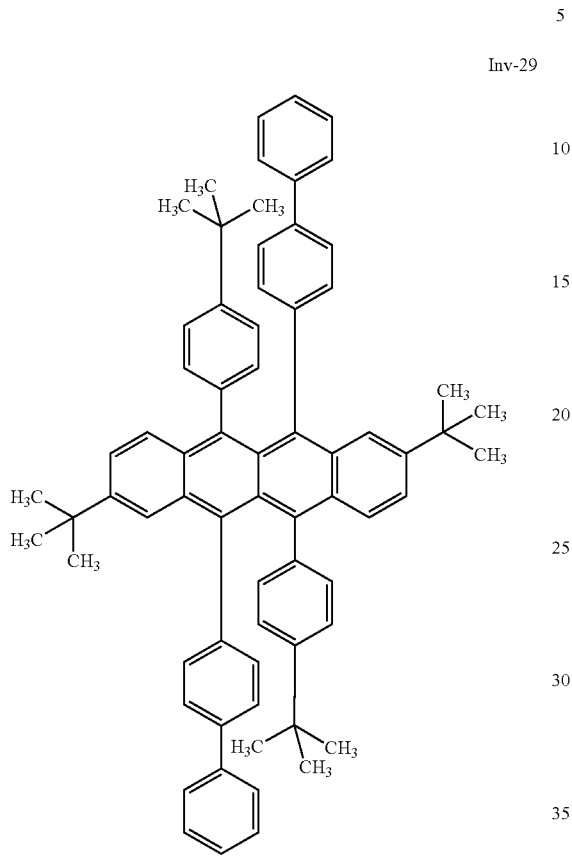
Inv-30
Inv-31
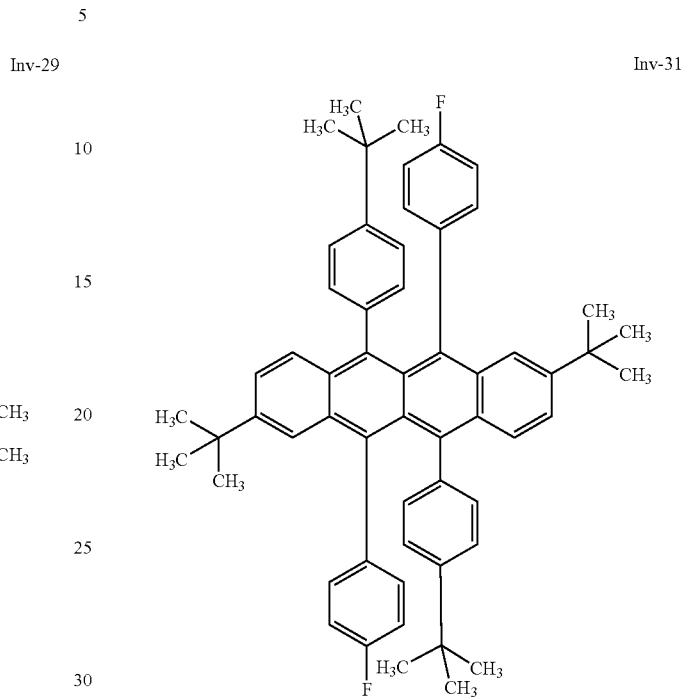
Inv-32
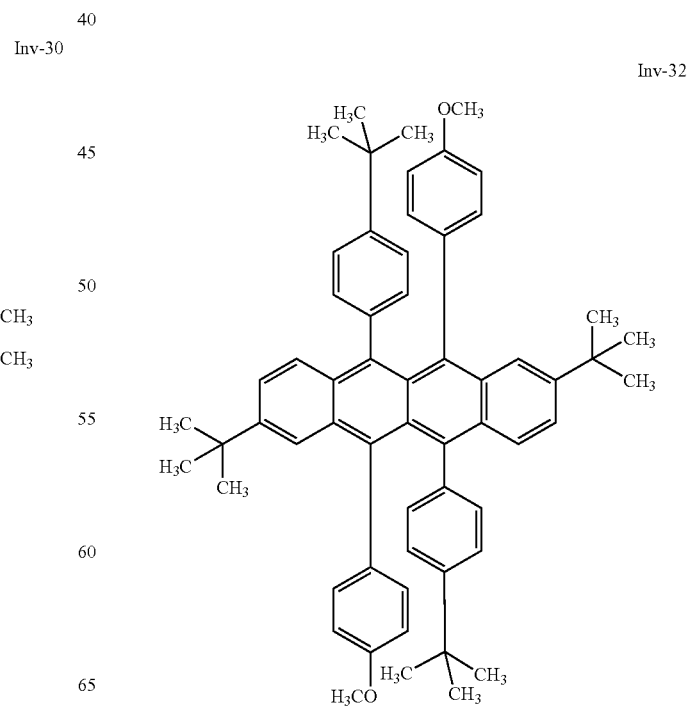

-continued
Inv-33
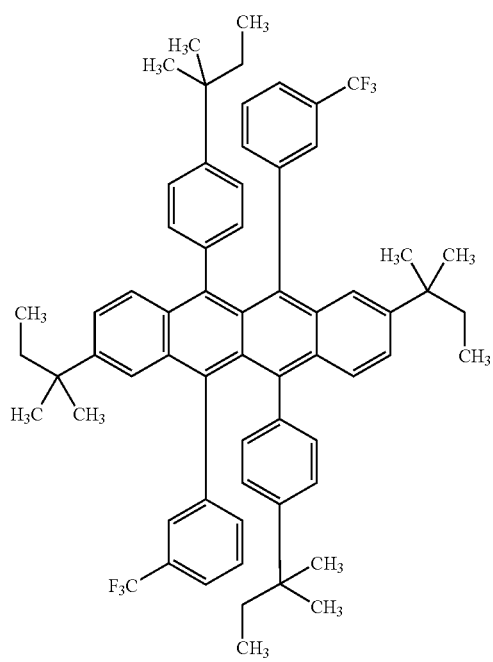
Inv-34
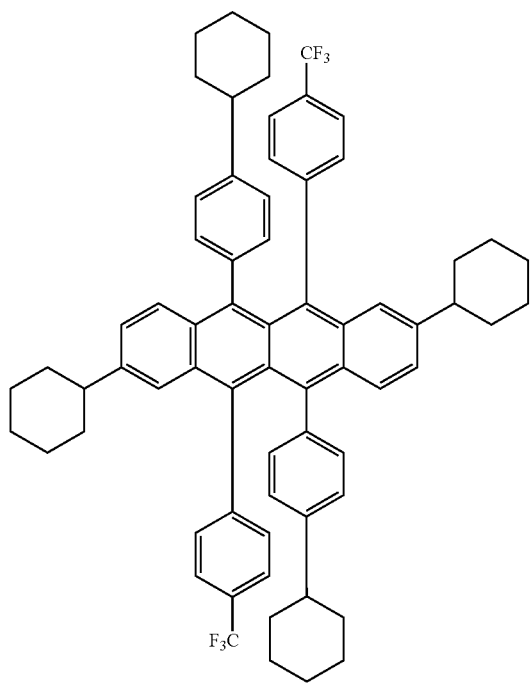
-continued
Inv-35
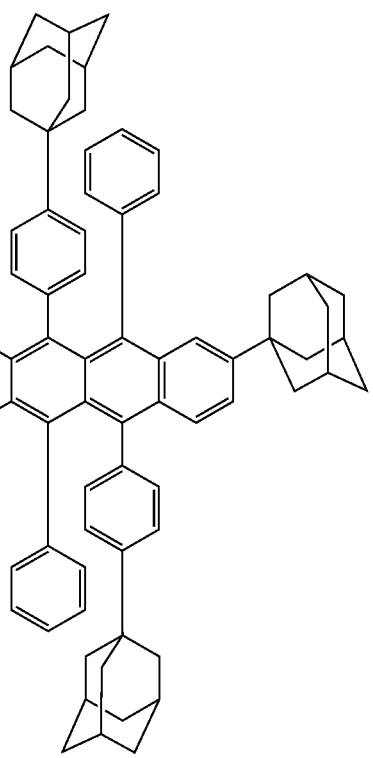
Inv-36
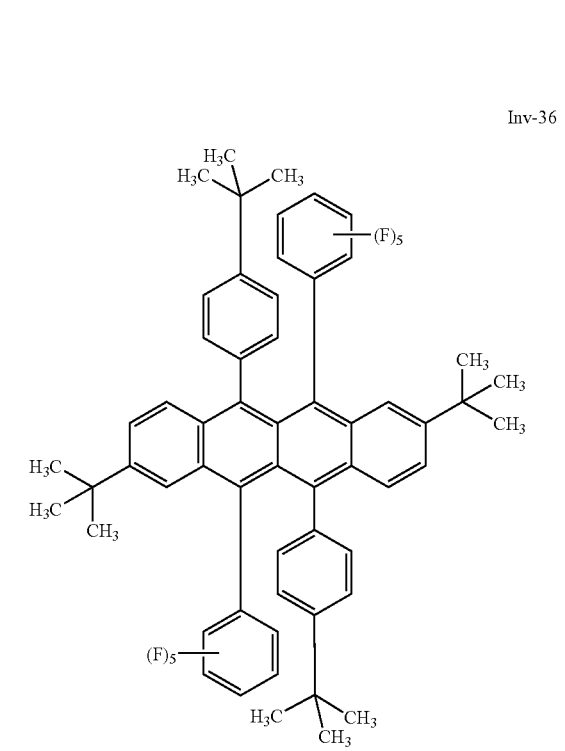

Inv-37
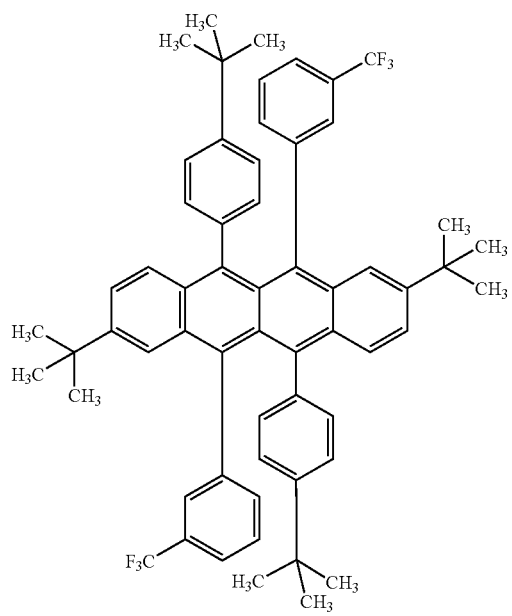
Inv-38
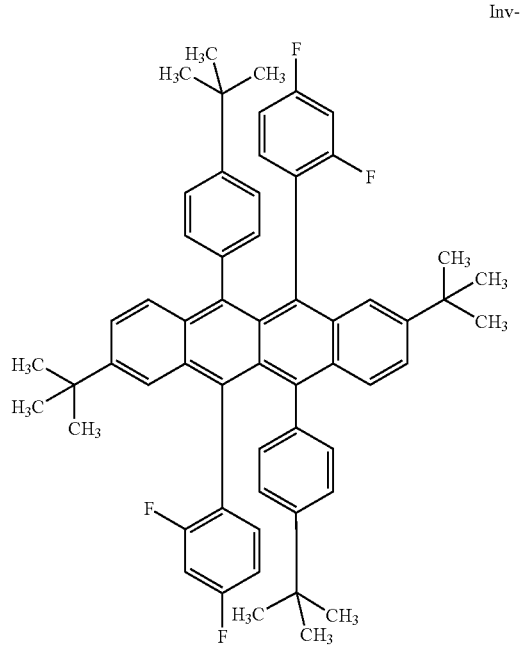
Inv-39
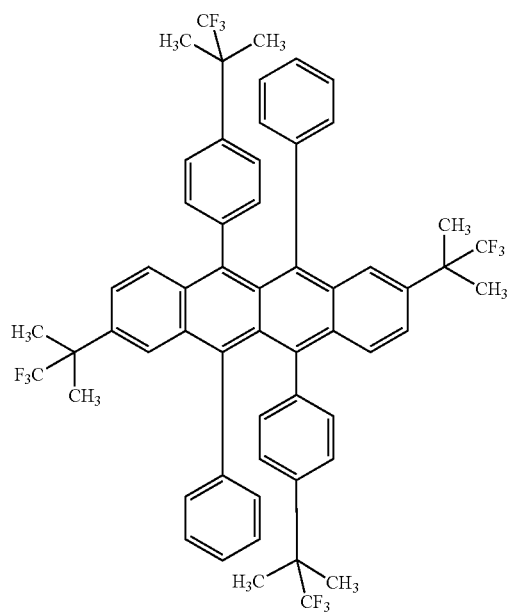
Inv-40
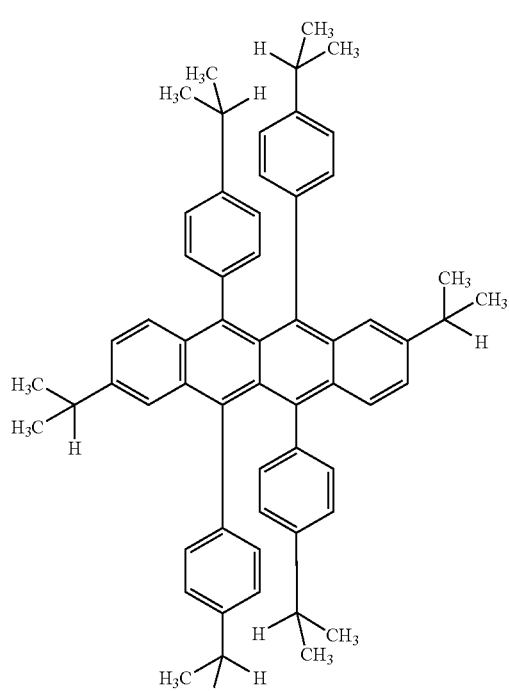

-continued

Inv-41

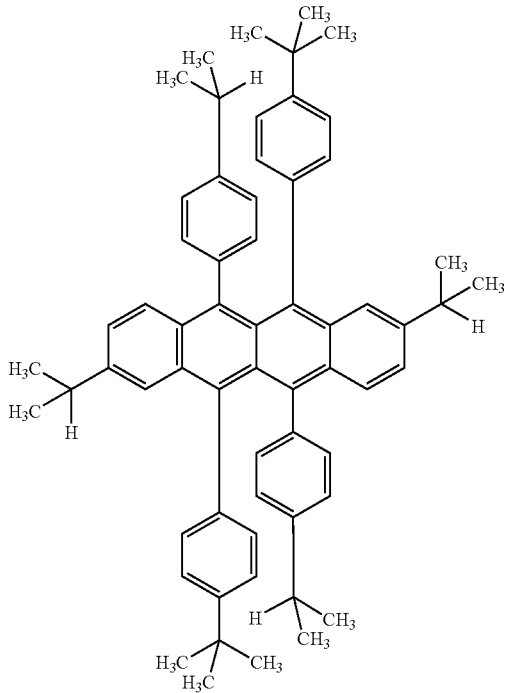

Embodiments of the invention provide not only improved luminance efficiency but also improved thermal stability thus allowing them to be used in the manufacture of OLED devices, which requires the materials to be heated over prolonged periods and at high temperatures.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, an HTL and an LEL. A more typical structure is shown in FIG. 1 and contains a substrate 101, an anode 103, an optional hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. Also, the total combined thickness of the organic layers is preferably less than 500 nm.

The following are non-limiting examples of white EL devices. In each case the device contains at least one yellow light-emitting material of Formula (I).

The layer 107 includes a light-emitting material. In one embodiment, layer 107 includes a yellow light-emitting material and layer 109 includes a blue or blue-green light-emitting material.

Figure 2:
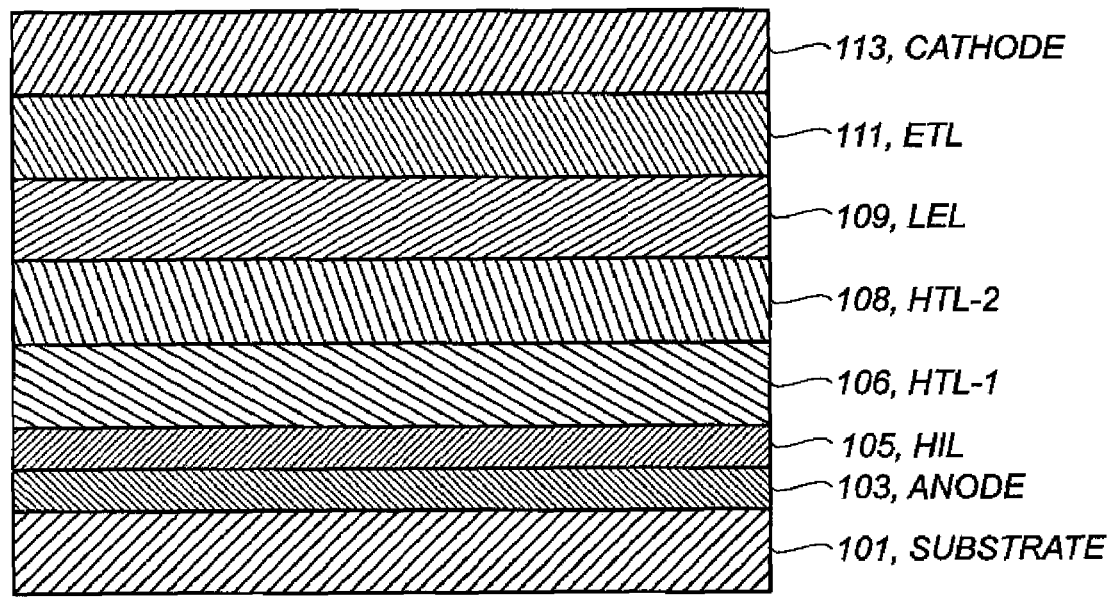
FIG. 2 depicts another structure of white light producing EL device wherein the hole-transporting layer has two sub layers, one of which includes a light-emitting material.

FIG. 2, depicts an organic white light-emitting device which is similar to that shown in FIG. 1, except that the hole-transporting layer 107 comprises two sub layers, layer 106 and layer 108.

In one desirable embodiment, layer 108 includes a yellow-light emitting material and layer 109 includes a blue or blue-green light emitting-material.

Figure 3:
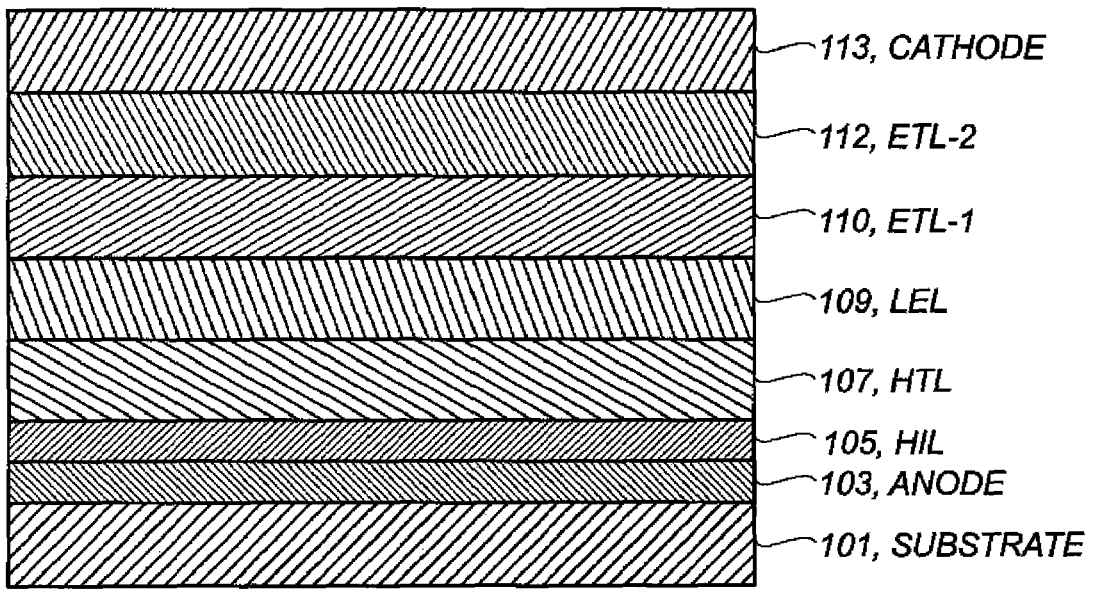
FIG. 3 depicts another structure of white light producing EL device wherein the electron-transporting layer has two sub layers, one of which includes a light-emitting material. The hole-transporting layer also includes a light-emitting material.

FIG. 3 depicts an organic white light-emitting device, which is similar to FIG. 1 except electron-transporting layer 111 comprises two sub layers, 110 and 112.

In one desirable embodiment, layer 110 includes a yellow-light emitting material and layer 109 includes a blue-light emitting material.

In another desirable embodiment, layer 107 includes a yellow light-emitting material and layer 110 also includes a yellow light-emitting material which may be the same or different. Layer 109 includes a blue-light emitting material.

In another desirable embodiment layer 110 includes a green light-emitting material, layer 109 includes a blue light-emitting material, and layer 107 includes a yellow light-emitting material.

Figure 4:
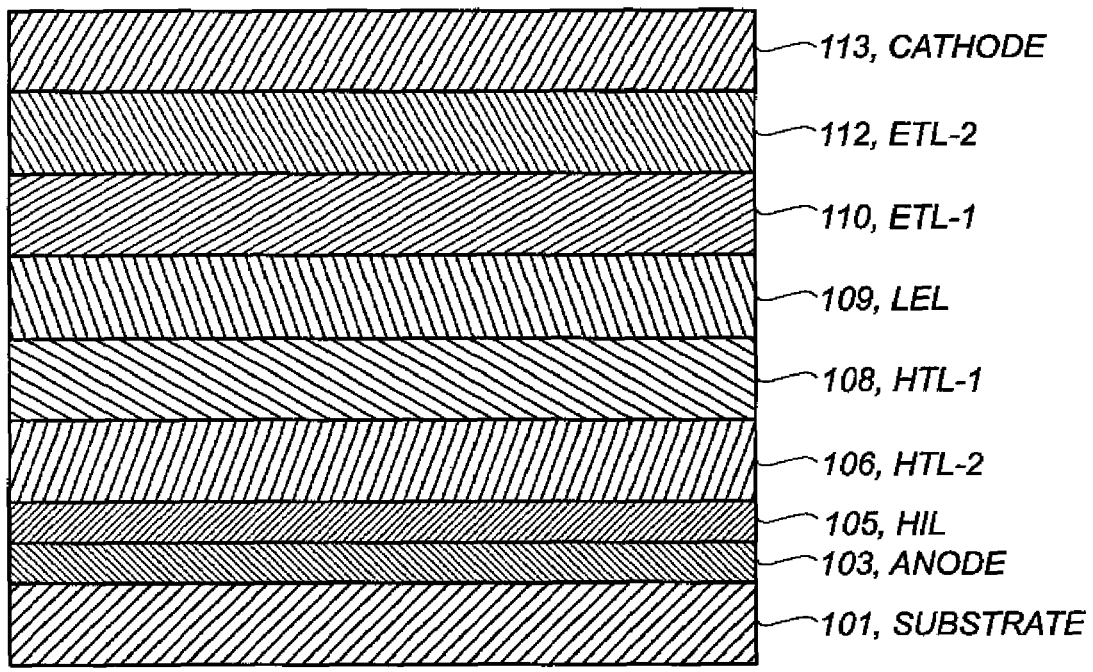
FIG. 4 depicts another structure of white light producing EL device wherein the electron-transporting layer has two sub layers, one of which includes a light-emitting material. The hole-transporting layer also has two sub layers one of which includes a light-emitting material.

FIG. 4 depicts an organic white light-emitting device, which is similar to FIG. 1 except that the hole-transporting layer 107 comprises two sub layers, layer 106 and layer 108, and the electron-transporting layer 111 comprises two sub layers, 110 and 112.

In one desirable embodiment layer 108 includes a yellow light-emitting material and layer 110 also includes a yellow light-emitting material wherein the materials may be the same or different. Layer 109 includes a blue or blue green light-emitting material.

In another desirable embodiment, layer 108 includes a yellow light-emitting material, layer 109 includes a blue or blue green light-emitting material, and layer 110 includes a green light-emitting material.

Figure 5:
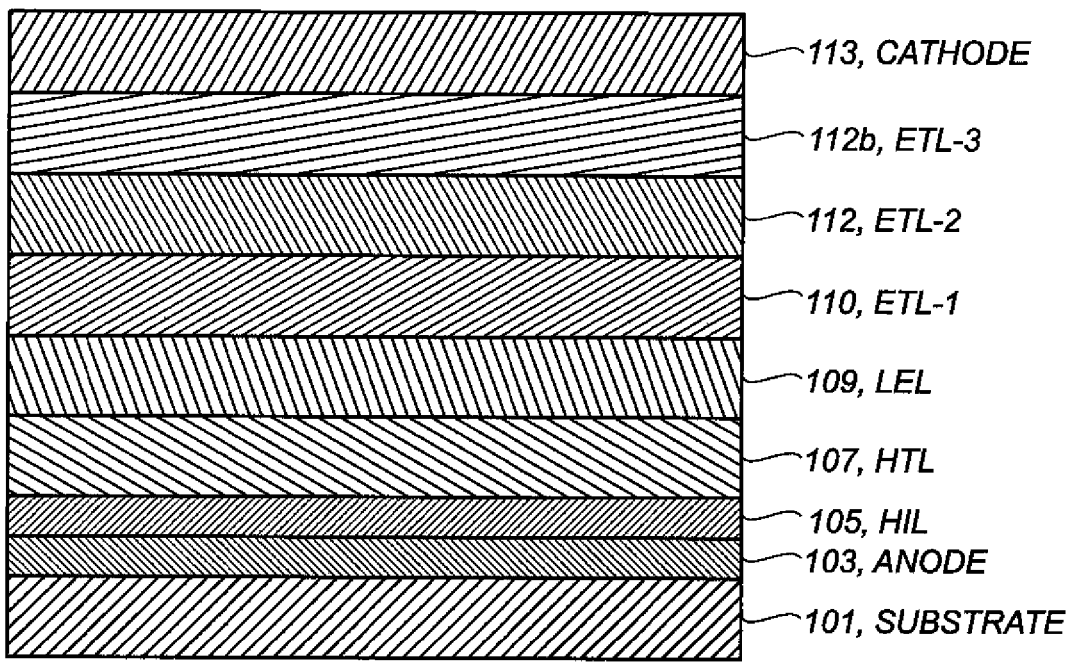
FIG. 5 depicts another structure of white light producing OLED device wherein electron-transporting layer has three sub layers, two of which include light-emitting materials. The hole-transporting layer also includes a light-emitting material.

FIG. 5 depicts an organic white light-emitting device, which is similar to FIG. 1 except that the electron-transporting layer 111 comprises three sub layers, 110, 112, and 112b.

In one desirable embodiment layer 112 includes a green light-emitting material, layer 110 includes a yellow light-emitting material and layer 109 includes a blue or blue green light-emitting material. Layer 107 includes a yellow light-emitting material which may be the same or different than that in layer 110.

Figure 6:
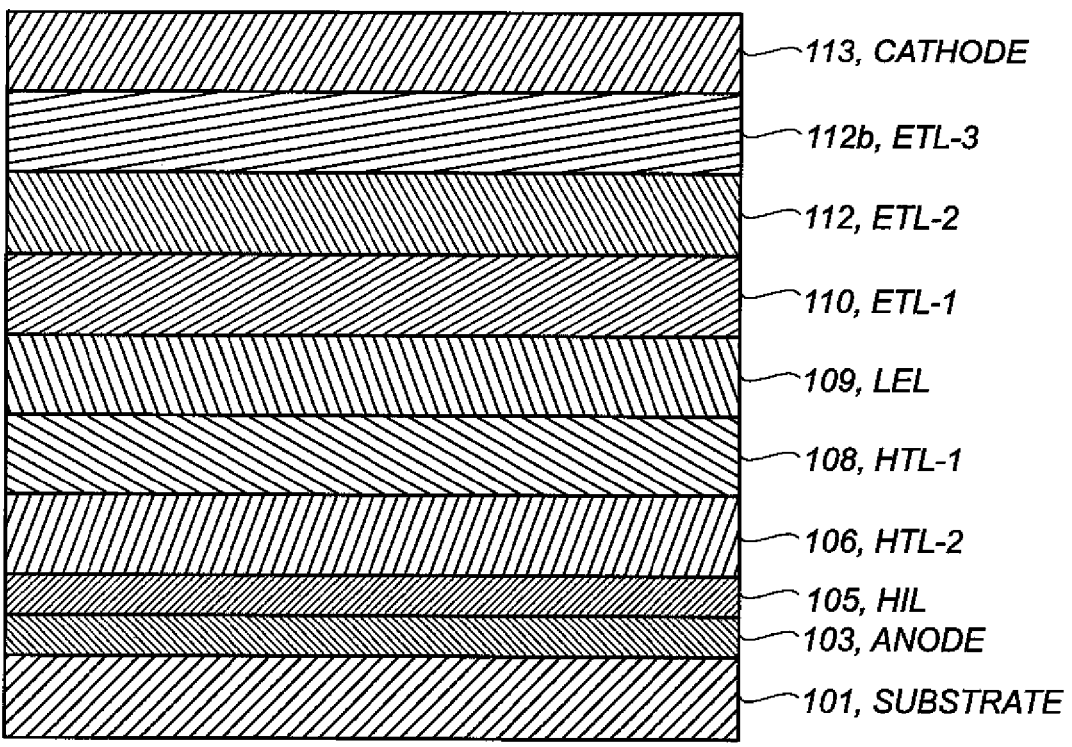
FIG. 6 depicts another structure of white light producing OLED device wherein the electron-transporting layer has three sub layers, two of which include light-emitting materials. The hole-transporting layer also has two sub layers one of which includes a light-emitting material.

FIG. 6 depicts an organic white light-emitting device, which is similar to FIG. 1 except that the hole-transporting layer 107 comprises two sub layers, layer 106 and layer 108, and the electron-transporting layer 111 comprises three sub layers, 110, 112, and 112b.

In one desirable embodiment layer 112 includes a green light-emitting material, layer 110 includes a yellow light-emitting material, and layer 109 includes a blue or blue green light-emitting material. Layer 108 includes a yellow light-emitting material which may be the same or different than that in layer 110.

Substrate

The substrate 101 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. The thickness of the HIL can be any suitable thickness. It can be in the range of from 0.1 nm to 100 nm. Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. Additionally, the hole-transporting layer may be constructed of one or more layers such that each layer can be doped or un-doped with the same or different light emitting material. The thickness of the HTL can be any suitable thickness. It can be in the range of from 0.1 to 300 nm. In one form, the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

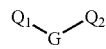

(A)

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene. When G is an aryl group, it is conveniently a phenylene, biphenylene, or naphthalene group.

A useful class of triarylamine groups satisfying structural formula (A) and containing two triarylamine groups is represented by structural formula (B):

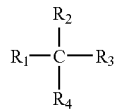

(B)

where
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural formula (C):

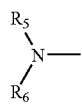

(C)

wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaryldiamines groups include two diarylamino groups, such as indicated by formula (C), linked through an arylene group. Useful tetraaryldiamines include those represented by formula (D).

(D)

wherein
each Are is an independently selected arylene group, such as a phenylene or anthracene group,
n is an integer of from 1 to 4, and
Ar, $R_7$, $R_8$, and $R_9$ are independently selected aryl groups. In a typical embodiment, at least one of Ar, $R_7$, $R_8$, and $R_9$ is a polycyclic fused ring group, e.g., a naphthalene.

The various alkyl, alkylene, aryl, and arylene groups of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl(NPB)
4,4'-Bis[N-(1-naphthyl)-N-(2-naphthyl)amino]biphenyl (TNB)
4,4"-Bis[N-(1-naphthyl)-N-phenylamino]$_p$-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl 4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants or light-emitting materials can be coated as 0.01 to 50% by weight into the host material, but typically coated as 0.01 to 30% and more typically coated as 0.01 to 15% by weight into the host material. The thickness of the LEL can be any suitable thickness. It can be in the range of from 0.1 nm to 100 nm.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

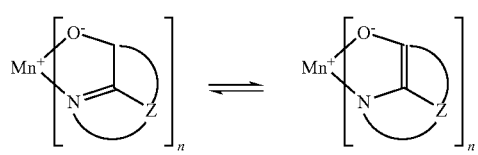

(E)

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)](AlQ3)

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-1-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

CO-10: Bis(2-methyl-8-quinolinato)-4-phenylphenolatoaluminum (III)

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for EL devices using Alq as the host material.

Shi et al. in commonly assigned U.S. Pat. No. 5,935,721 has described this dopant scheme in considerable details for the blue emitting OLED devices using 9,10-di-(2-naphthyl) anthracene (ADN) derivatives as the host material.

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

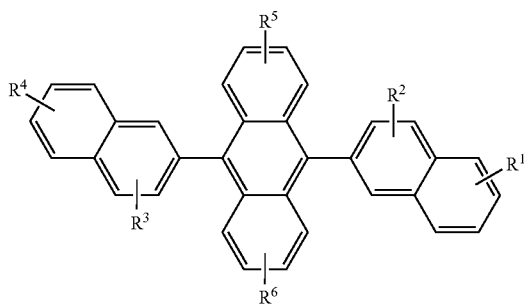

(F)

wherein: $R^1, R^2, R^3, R^4, R^5,$ and $R^6$ represent hydrogen or one or more substituents selected from the following groups:

Group 1: hydrogen, alkyl and alkoxy groups typically having from 1 to 24 carbon atoms;
Group 2: a ring group, typically having from 6 to 20 carbon atoms;
Group 3: the atoms necessary to complete a carbocyclic fused ring group such as naphthyl, anthracenyl, pyrenyl, and perylenyl groups, typically having from 6 to 30 carbon atoms;
Group 4: the atoms necessary to complete a heterocyclic fused ring group such as furyl, thienyl, pyridyl, and quinolinyl groups, typically having from 5 to 24 carbon atoms;
Group 5: an alkoxylamino, alkylamino, and arylamino group typically having from 1 to 24 carbon atoms; and
Group 6: fluorine, chlorine, bromine and cyano radicals.

Illustrative examples include 9,10-di-(2-naphthyl)anthracene (ADN) and 2-t-butyl-9,10-di-(2-naphthyl)anthracene (TBADN). Other anthracene derivatives can be useful as a host in the LEL, such as diphenylanthracene and its derivatives, as described in U.S. Pat. No. 5,927,247. Styrylarylene derivatives as described in U.S. Pat. No. 5,121,029 and JP 08333569 are also useful hosts for blue emission. For example, 9,10-bis[4-(2,2-diphenylethenyl)phenyl]anthracene, 4,4'-Bis(2,2-diphenylethenyl)-1,1'-biphenyl (DPVBi) and phenylanthracene derivatives as described in EP 681,019 are useful hosts for blue emission. Another useful host capable of supporting electroluminescence for blue-light emission is H-1 and its derivatives shown as follows:

H-1

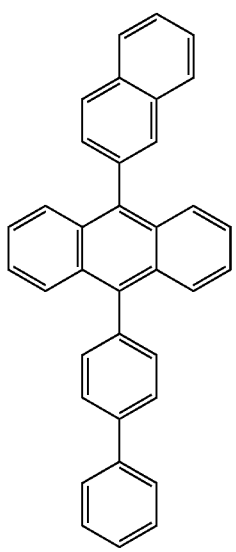

Benzazole derivatives (Formula G) constitute another class of useful hosts capable of supporting electroluminescence, and are particularly suitable for light emission of wavelengths longer than 400 nm, e.g., blue, green, yellow, orange or red.

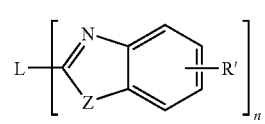

(G)

where:
n is an integer of 3 to 8;
Z is —O, —NR or —S where R is H or a substituent; and
R' represents one or more optional substituents where R and each R' are H or alkyl groups such as propyl, t-butyl, and heptyl groups typically having from 1 to 24 carbon atoms; carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;
L is a linkage unit usually comprising an alkyl or ary group which conjugately or unconjugately connects the multiple benzazoles together.

An example of a useful benzazole is 2,2', 2"-(1,3,5-phenylene)tris[1-phenyl-1H-benzimidazole].

Distyrylarylene derivatives as described in U.S. Pat. No. 5,121,029 are also useful host materials in the LEL.

Desirable fluorescent dopants include groups derived from fused ring, heterocyclic and other compounds such as anthracene, tetracene, xanthene, perylene, rubrene, coumarin, rhodamine, quinacridone, dicyanomethylenepyran, thiopyran, polymethine, pyrilium thiapyrilium, and carbostyryl compounds. Dopants or light-emitting materials can be coated as 0.01 to 50% by weight into the host material, but typically coated as 0.01 to 30% and more typically coated as 0.01 to 15% by weight into the host material. Particularly useful blue dopants of the perylene class include perylene (L1) and tetra-t-butylperylene (TBP, L2). Other illustrative examples of useful dopants include, but are not limited to, the following:

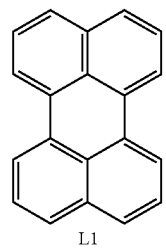

L1

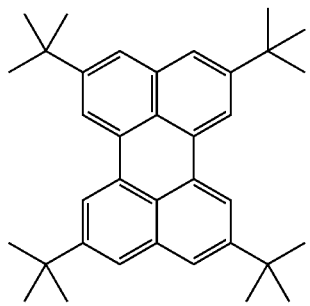

L2

-continued

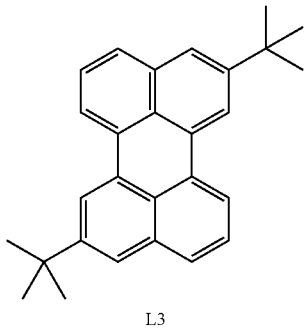

L3

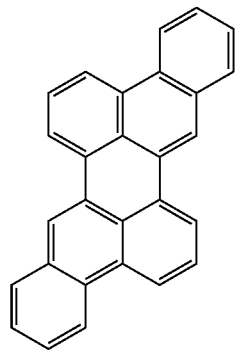

L4

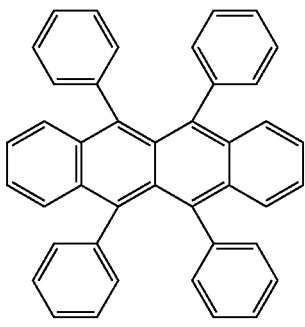

L5

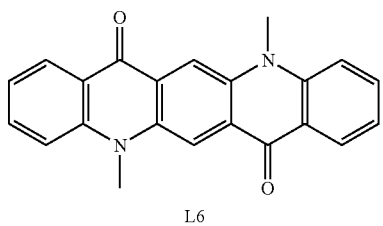

L6

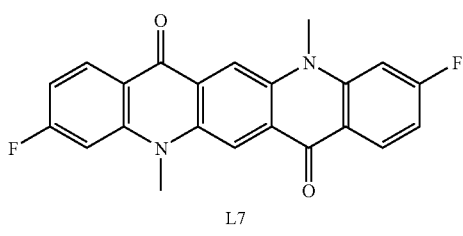

L7

-continued

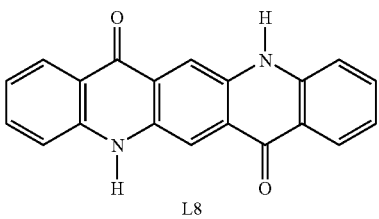

L8

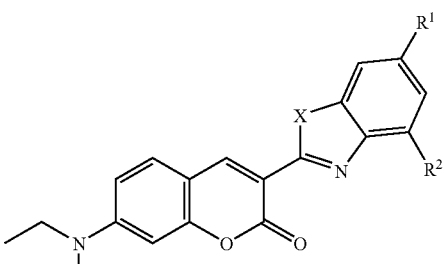

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

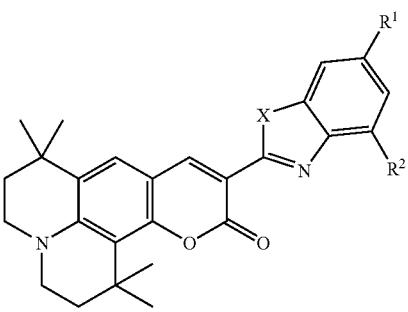

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

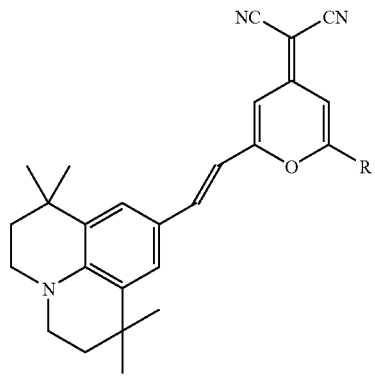

| | R |
|---|---|
| L37 | phenyl |
| L38 | methyl |
| L39 | t-butyl |
| L40 | mesityl |

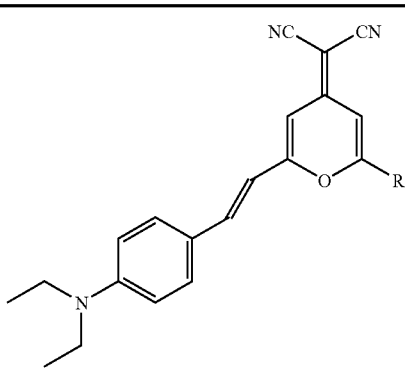

| | R |
|---|---|
| L41 | phenyl |
| L42 | methyl |
| L43 | t-butyl |
| L44 | mesityl |

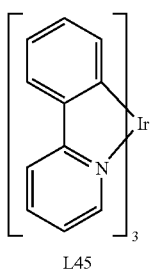

L45

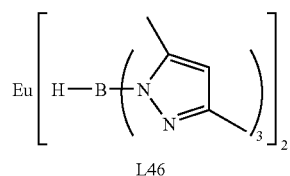

L46

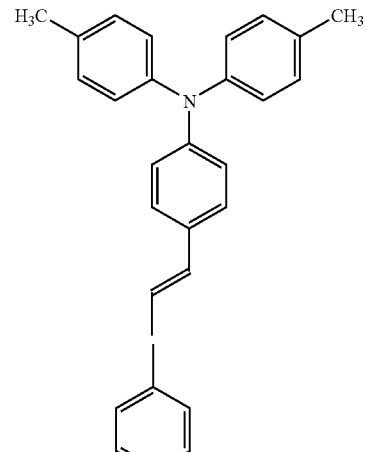

L47

L48

Many blue fluorescent dopants are known in the art, and are contemplated for use in the practice of this invention. Blue dopants or light-emitting materials can be coated as 0.01 to 50% by weight into the host material, but typically coated as 0.01 to 30% and more typically coated as 0.01 to 15% by weight into the host material. The thickness of the blue-light emitting can be any suitable thickness. It can be in the range of from 10 to 100 nm. Particularly useful classes of blue-emitting dopants include perylene and its derivatives such as 2,5,8,11-tetra-tert-butyl perylene (TBP), and distyrylamine derivatives as described in U.S. Pat. No. 5,121,029, such as L47 (structure shown above).

Another useful class of blue-emitting dopants is represented by Formula 2 and is described in commonly assigned U.S. Pat. No. 6,661,023 (Feb. 9, 2003) by Benjamin P. Hoag et al., entitled "Organic Element for Electroluminescent Devices"; the disclosure of which is incorporated herein.

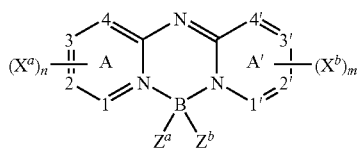

Formula 2 wherein:
A and A' represent independent azine ring systems corresponding to 6-membered aromatic ring systems containing at least one nitrogen;
each $X^a$ and $X^b$ is an independently selected substituent, two of which may join to form a fused ring to A or A';
m and n are independently 0 to 4;
$Z^a$ and $Z^b$ are independently selected substituents; and
1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred embodiments further include devices where the two fused ring systems are quinoline or isoquinoline systems; the aryl or heterocyclic substituent is a phenyl group; there are present at least two $X^a$ groups and two $X^b$ groups which join to form a 6-6 fused ring, the fused ring systems are fused at the 1-2,3-4,1'-2', or 3'-4' positions, respectively; one or both of the fused rings is substituted by a phenyl group; and where the dopant is depicted in Formulae 3, 4, or 5.

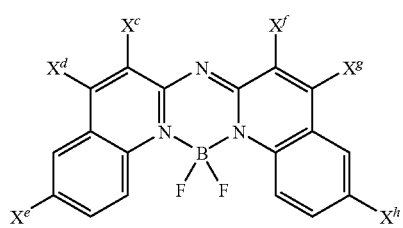

Formula 3

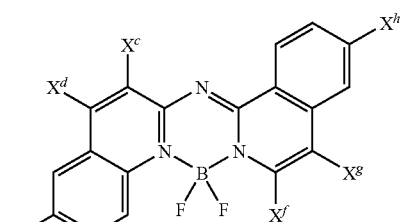

Formula 4

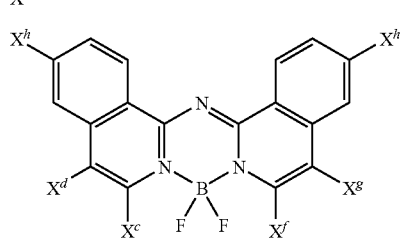

Formula 5 wherein each $X^c$, $X^d$, $X^e$, $X^f$, $X^g$, and $X^h$ is hydrogen or an independently selected substituent, one of which must be an aryl or heterocyclic group.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Illustrative, non-limiting examples of boron compounds complexed by two ring nitrogens of a deprotonated bis(azinyl)amine ligand, wherein the two ring nitrogens are members of different 6,6 fused ring systems in which at least one of the systems contains an aryl or heterocyclic substituent, useful in the present invention are the following:

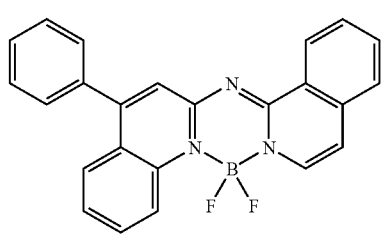

B-1

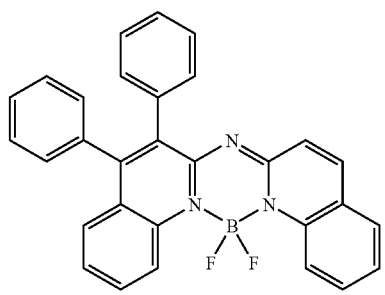

B-2

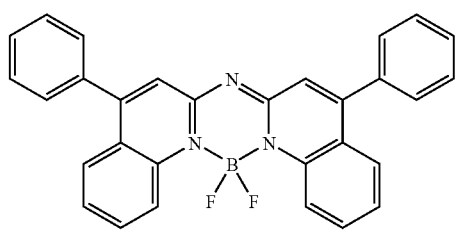

B-3

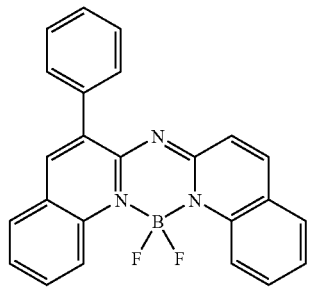

B-4

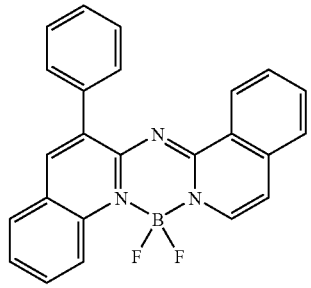

B-5

-continued

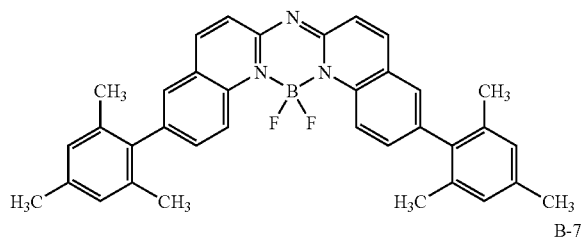
B-6

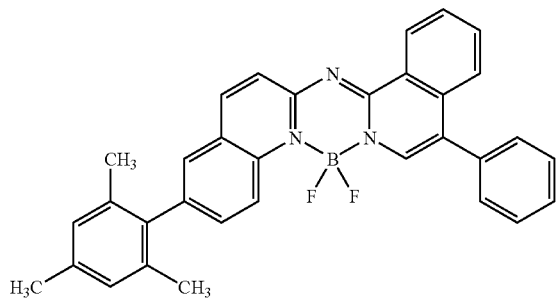
B-7

Coumarins represent a useful class of green-emitting dopants as described by Tang et al. in U.S. Pat. Nos. 4,769,292 and 6,020,078. Green dopants or light-emitting materials can be coated as 0.01 to 50% by weight into the host material, but typically coated as 0.01 to 30% and more typically coated as 0.01 to 15% by weight into the host material. Examples of useful green-emitting coumarins include C545T and C545TB. Quinacridones represent another useful class of green-emitting dopants. Useful quinacridones are described in U.S. Pat. No. 5,593,788, publication JP 09-13026A, and commonly assigned U.S. patent application Ser. No. 10/184,356 filed Jun. 27, 2002 by Lelia Cosimbescu, entitled "Device Containing Green Organic Light-Emitting Diode", the disclosure of which is incorporated herein.

Examples of particularly useful green-emitting quinacridones are shown below:

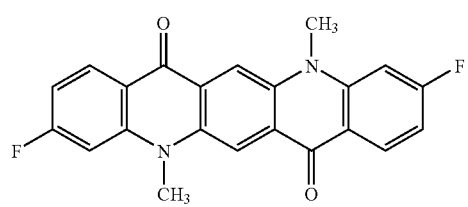
G-1

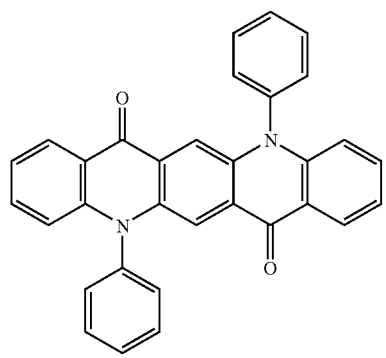
G-2

Formula 6 below represents another class of green-emitting dopants useful in the invention.

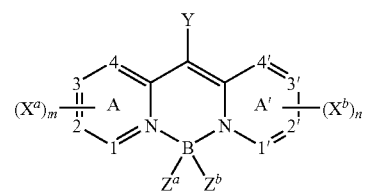
Formula 6 wherein:
A and A' represent independent azine ring systems corresponding to 6-membered aromatic ring systems containing at least one nitrogen;
each $X^a$ and $X^b$ is an independently selected substituent, two of which may join to form a fused ring to A or A';
m and n are independently 0 to 4;
Y is H or a substituent;
$Z^a$ and $Z^b$ are independently selected substituents; and
1, 2, 3, 4, 1', 2', 3', and 4' are independently selected as either carbon or nitrogen atoms.

In the device, 1, 2, 3, 4, 1', 2', 3', and 4' are conveniently all carbon atoms. The device may desirably contain at least one or both of ring A or A' that contains substituents joined to form a fused ring. In one useful embodiment, there is present at least one $X^a$ or $X^b$ group selected from the group consisting of halide and alkyl, aryl, alkoxy, and aryloxy groups. In another embodiment, there is present a $Z^a$ and $Z^b$ group independently selected from the group consisting of fluorine and alkyl, aryl, alkoxy and aryloxy groups. A desirable embodiment is where $Z^a$ and $Z^b$ are F. Y is suitably hydrogen or a substituent such as an alkyl, aryl, or heterocyclic group.

The emission wavelength of these compounds may be adjusted to some extent by appropriate substitution around the central bis(azinyl)methene boron group to meet a color aim, namely green. Some examples of useful formulas follow:

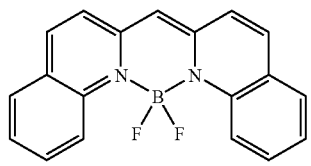
G-3

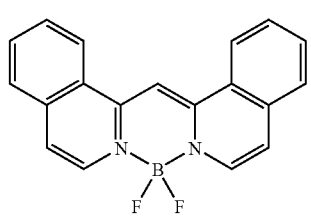
G-4

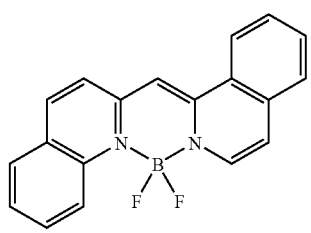
G-5

-continued

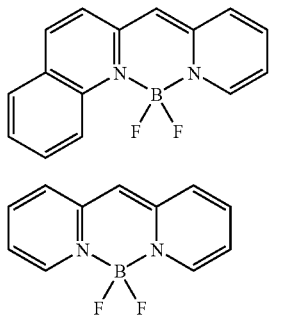

G-6

G-7

Naphthacenes and derivatives thereof also represent a useful class of emitting dopants which can be used as stabilizers. These dopant materials can be coated as 0.01 to 50% by weight into the host material, but typically coated as 0.01 to 30% and more typically coated as 0.01 to 15% by weight into the host material. Naphthacene derivative Y-1 (alias t-BuDPN) below, is an example of a dopant material used as a stabilizer:

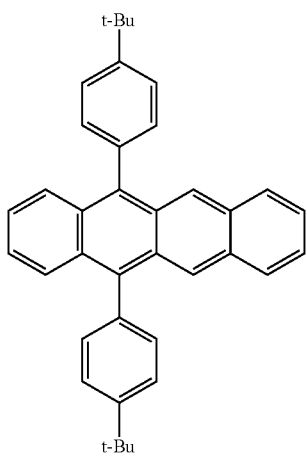

Y-1

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers 109 and 111 can optionally be collapsed into a single layer that serves the function of supporting both light emission and electron transportation. The thickness of the ETL can be any suitable thickness. It can be in the range of from 0.1 nm to 100 nm.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. Cathode materials are comprised of Mg:Ag, Al:Li and Mg:Al alloys. A Preferred cathode material is comprised of Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. No. 5,059,861, U.S. Pat. No. 5,059,862, and U.S. Pat. No. 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The invention and its advantages are further illustrated by the specific examples that follow. The term "percentage" indicates the volume percentage (or a thickness ration as measured on the thin film thickness monitor) of a particular dopant with respect to the host material.

The entire contents of the patents and other publications referred to in this specification are incorporated herein by reference.

EXAMPLES

The inventions and its advantages are further illustrated by the specific examples, which follow.

Example 1

Synthesis (Scheme 1)

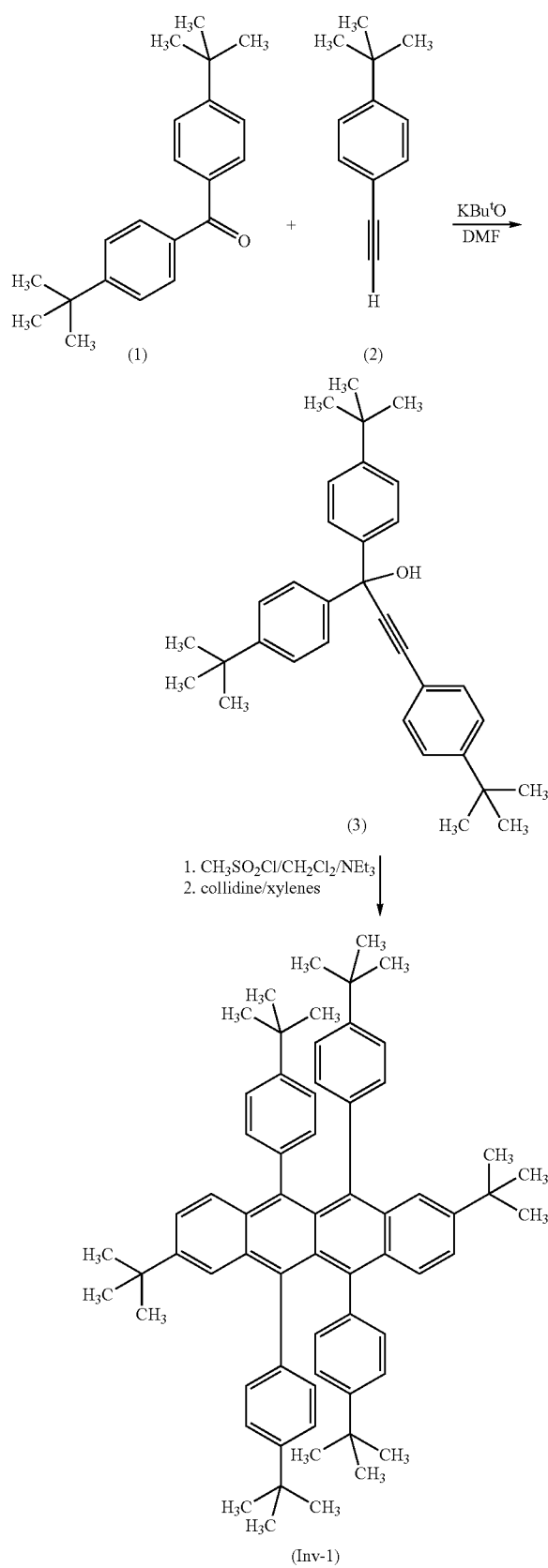

Preparation of compound (3): Under a nitrogen atmosphere, acetylenic compound (2) (2.0 g, 12 mMole), was dissolved in dimethylformamide (DMF) (100 mL) and the solution cool to 0° C. Potassium t-butoxide (KBu$^t$O) (1.4 g, 12 mMole), was added and the mixture stirred well for approximately 15 minutes. To this mixture was then added the benzophenone (1) (3.53 g, 30 mMole). Stirring was continued at 0° C. for approximately 30 minutes and then allowed to come to room temperature over a 1-hour period. At the end of this time the solution was cooled to 0° C. and the reaction treated with saturated sodium chloride (20 mL). The mixture was then diluted with ethyl acetate, washed with 2N—HCl (x3), dried over MgSO$_4$, filtered and concentrated under reduced pressure. The crude product was triturated with petroleum ether to give the product as an off-white solid. Yield of compound (3), 3.0 g.

Preparation of Inventive Compound, Inv-1: Compound (3) (7.0 g, 15 mMole) was dissolved in methylene chloride (CH$_2$Cl$_2$) (70 mL), and stirred at 0° C. under a nitrogen atmosphere. To this solution was added triethylamine (NEt$_3$) (1.56 g, 15 mMole) and then treated drop by drop with methanesulfonyl chloride (CH$_3$SO$_2$Cl) (1.92 g, 15 mMole), keeping the temperature of the reaction in the range 0-5° C. After the addition the solution was stirred at OC for 30 minutes and then allowed to warm to room temperature over 1 hour. The reaction was then heated to reflux, distilling off the methylene chloride solvent and gradually replacing it with xylenes (a total of 70 mL). When the internal temperature of the reaction reached 80° C., collidine (2.40 g, 19.82 mMole), dissolved in xylenes (10 mL) was added drop by drop over a 10-minute period. The temperature was then raised to 110° C. and held at this temperature for 4 hours. After this period the reaction was cooled and concentrated under reduced pressure. The oily residue was stirred with methanol (70 mL) to give the crude product. This material was filtered off, washed with methanol and petroleum ether to give inventive compound Inv-1 as a bright red solid. Yield 1.5 g with a melting point of 300-305° C. The product may be further purified by sublimation (250° C. @ 200 millitorr) with a N$_2$ carrier gas.

The comparative compounds used in the invention are as follows:

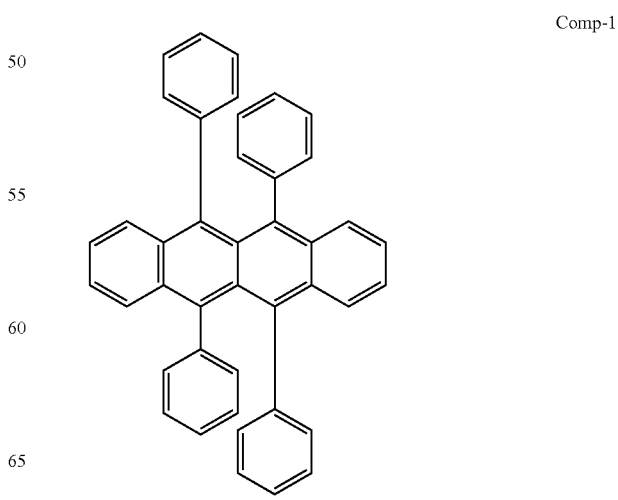

Comp-1

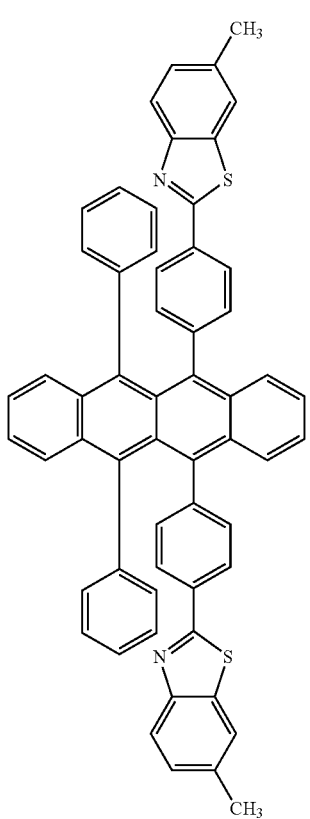

Comp-2

Comp-1 is the parent rubrene and falls outside the scope of the current invention. It is well known to those in the art and has no substituents at the 2- and 8-positions on either of the end rings of the naphthacene nucleus, nor on the four phenyl rings located on the center rings of the naphthacene. Comp-2 also falls outside the scope of the current invention. It has heterocyclic groups in the para-position of the phenyl groups in the 5- and 12-positions.

Example 2

EL Device Fabrication—Inventive Example

An EL device satisfying the requirements of the invention was constructed as Sample 1 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of $CHF_3$.

b) A hole-transporting layer (HTL) of N,N'-di-1-naphthalenyl-N,N'-diphenyl-4,4'-diaminobiphenyl (NPB) having a thickness of 130 nm was then evaporated onto a).

c) A second hole-transporting layer (HTL) of N,N'-di-1-naphthalenyl-N,N'-diphenyl-4,4'-diaminobiphenyl (NPB) having a thickness of 20 nm and yellow emitting dopant material Inv-1 (nominally 2.5%-wt, see Table 1) were then deposited onto hole-transporting layer b).

d) A 20 nm blue light-emitting layer (LEL) of 2-t-butyl-9,10-di-(2-naphthyl)anthracene (TBADN) and blue emitting dopant material L47, (nominally 2.5%-wt.) were then deposited onto the hole-transporting layer.

e) A 35 nm electron-transporting layer (ETL) of tris(8-quinolinolato)aluminum (III) ($AlQ_3$) was then deposited onto d).

f) On top of the ETL-$AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The results for Example 2 are recorded in Table 1 as Sample 1. Sample 2 of Table 1 and Sample 6 of Table 2 are the EL devices incorporating comparison compound Comp-1, fabricated in an identical manner and at the same nominal level of 2.5%-wt. as Example 2. Sample 3 of Table 1 is the EL device incorporating comparison compound Comp-2 also fabricated in an identical manner and at the same nominal level of 2.5%-wt. as Example 2. Samples 4 and 5 of Table 2 are the EL devices incorporating Inv-2 fabricated in an identical manner to Example 2 at the nominal levels of 2 and 3%-wt. respectively. Samples 7 and 8 of Table 2 are the EL devices incorporating Comp-2, also fabricated in an identical manner to Example 2 and at the nominal levels of 2 and 3%-wt. respectively. The cells thus formed were tested for luminance yields and efficiencies, and the results are listed in Tables 1 and 2.

TABLE 1

Evaluation Results for EL devices.

| Sample | Dopant | Type | Dopant Conc. (%) | Yield (cd/A)[1] | Efficiency (W/A)[1] |
|---|---|---|---|---|---|
| 1 | Inv-1 | Inventive | 2.4 | 8.62 | 0.080 |
| 2 | Comp-1 | Comparative | 2.5 | 6.84 | 0.062 |
| 3 | Comp-2 | Comparative | 2.3 | 8.23 | 0.075 |

[1]Luminance yields and efficiencies reported at 20 $mA/cm^2$.

TABLE 2

Evaluation Results for EL devices.

| Sample | Dopant | Type | Dopant Conc. (%) | Yield (cd/A)[1] | Efficiency (W/A)[1] |
|---|---|---|---|---|---|
| 4 | Inv-2 | Inventive | 1.9 | 10.05 | 0.086 |
| 5 | Inv-2 | Inventive | 2.8 | 10.12 | 0.086 |
| 6 | Comp-1 | Comparative | 2.5 | 6.84 | 0.062 |
| 7 | Comp-2 | Comparative | 2.1 | 9.16 | 0.082 |
| 8 | Comp-2 | Comparative | 3.1 | 9.35 | 0.083 |

[1]Luminance yields and efficiencies reported at 20 $mA/cm^2$.

As can be seen from Tables 1 and 2, all tested EL devices incorporating the dopants of the invention at 2.5%-wt of the host for Inv-1, 2%-wt. and 3%-wt. of the host for Inv-2, demonstrated higher luminance yields and efficiencies over the comparative materials Comp-1 and Comp-2.

TABLE 3

Thermal Stability.

| Sample | Dopant | Type | Sublimation Temp. (° C.) | Heating Temp. (° C.) | % Dopant Remaining[2] |
|---|---|---|---|---|---|
| 9 | Inv-1 | Inventive | 222 | 245 | 99 |
| 10 | Inv-2 | Inventive | 300 | 334 | 96 |

TABLE 3-continued

Thermal Stability.

| Sample | Dopant | Type | Sublimation Temp. (° C.) | Heating Temp. (° C.) | % Dopant Remaining[2] |
|---|---|---|---|---|---|
| 11 | Comp-1 | Comparative | 240 | 271 | 100 |
| 12 | Comp-2 | Comparative | 325 | 356 | 0 |

[2]% Dopant remaining after heating under vacuum at a temperature of 6% (in degrees Kelvin) above the sublimation temperature of the material, for 7 days.

Table 3 shows the thermal stability of Inv-1 and Inv-2 in comparison to the comparative compounds, Comp-1 and Comp-2. The materials were heated under vacuum, to a temperature of 6% (as calculated in degrees Kelvin) above the sublimation temperature of the particular material and then held at this temperature for 7 days. After this period the materials were analyzed and the amount of dopant material remaining, expressed as a percentage of the original amount, determined.

Sample 12 shows that under these conditions, there is no Comp-2 left. Although Sample 11 shows 100% of Comp-1 remaining, Tables 1 and 2 show that Comp-1 has low luminance yield and efficiency. However, the compounds of the invention have both superior thermal stability and higher luminance than the comparison compounds.

Example 3

EL Device Fabrication—Inventive Example

An EL device satisfying the requirements of the invention was constructed as Sample 13, 14, 16 and 17 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of $CHF_3$.

b) A hole-transporting layer (HTL) of N,N'-di-1-naphthalenyl-N,N'-diphenyl-4,4'-diaminobiphenyl (NPB) having a thickness of 260 nm was then evaporated onto a).

c) A second hole-transporting layer (HTL) of N,N'-di-1-naphthalenyl-N,N'-diphenyl-4,4'-diaminobiphenyl (NPB) having a thickness of 20 nm and yellow emitting dopant material Inv-1 or Inv-2 (3.5%-wt.) were then deposited onto hole-transporting layer b).

d) A 45 nm blue light-emitting layer (LEL) of blue host H-1, doped with NPB (7%-wt) and co-doped with either blue emitting dopant material TBP or B-6 (1%-wt.) were then deposited onto the hole-transporting layer.

e) A 10 nm electron-transporting layer (ETL) of tris(8-quinolinolato)aluminum (III) ($AlQ_3$) was then deposited onto the blue light-emitting layer.

f) On top of the ETL-$AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

Example 4

EL Device Fabrication—Inventive Example

An EL device satisfying the requirements of the invention was constructed as Samples 15 and 18 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of $CHF_3$.

b) A hole-transporting layer (HTL) of N,N'-di-1-naphthalenyl-N,N'-diphenyl-4,4'-diaminobiphenyl (NPB) having a thickness of 260 nm was then evaporated onto a).

c) A second hole-transporting layer (HTL) of N,N'-di-1-naphthalenyl-N,N'-diphenyl-4,4'-diaminobiphenyl (NPB) having a thickness of 20 nm, doped with yellow emitting dopant material Inv-1 or Inv-2 (3.5%-wt.) and co-doped with t-BuDPN (10%) were then deposited onto hole-transporting layer b).

d) A 45 nm blue light-emitting layer (LEL) of blue host H-1, doped with NPB (7%-wt) and co-doped with blue emitting dopant material B-6, (1%-wt.) Were then deposited onto the hole-transporting layer.

e) A 10 nm electron-transporting layer (ETL) of tris(8-quinolinolato)aluminum (III) ($AlQ_3$) was then deposited onto the blue light-emitting layer.

f) On top of the ETL-$AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

It should be understood that the hole-transporting layer can be co-doped with other stabilizing dopants such as t-BuDPN along with naphthacene derivatives of this invention, as shown in Samples 15 and 18. Similarly, the blue emitting layer can consist of co-dopants such as NPB, a hue modifier for the blue emitting layer, along with blue emitting dopants, as shown in Samples 13 through 18. The concentration of these co-dopants is from 0.5 to 30% and preferably between 5 to 20%.

TABLE 4

Evaluation Results for EL devices.

| Sample | Yellow Dopant Conc. (%) | Yellow Co-dopant Conc. (%) | Blue Dopant Conc. (%) | Blue Co-dopant Conc. (%) | Yield (cd/A)[1] | Efficiency (W/A)[1] |
|---|---|---|---|---|---|---|
| 13 | Inv-1 (3.5) | 0 | TBP (1) | NPB (7) | 8.96 | 0.112 |
| 14 | Inv-1 (3.5) | 0 | B-6 (1) | NPB (7) | 11.57 | 0.119 |
| 15 | Inv-1 (3.5) | t-BuDPN (10) | B-6 (1) | NPB (7) | 13.02 | 0.120 |

TABLE 4-continued

Evaluation Results for EL devices.

| Sample | $CIE_x$ | $CIE_y$ | Drive Voltage (Volts) | Operational Stability ($t_{1/2}$ in hrs @ 80 mA/cm$^2$) |
|---|---|---|---|---|
| 13 | 0.257 | 0.267 | 9.14 | 188 |
| 14 | 0.362 | 0.313 | 9.01 | 119 |
| 15 | 0.396 | 0.352 | 9.08 | 161 |

[1]Luminance yields and efficiencies reported at 20 mA/cm$^2$.

TABLE 5

Evaluation Results for EL devices.

| Sample | Yellow Dopant Conc. (%) | Yellow Co-dopant Conc. (%) | Blue Dopant Conc. (%) | Blue Co-dopant Conc. (%) | Yield (cd/A)[1] | Efficiency (W/A)[1] |
|---|---|---|---|---|---|---|
| 16 | Inv-2 (3.5) | 0 | TBP (1) | NPB (7) | 13.63 | 0.127 |
| 17 | Inv-2 (3.5) | 0 | B-6 (1) | NPB (7) | 11.57 | 0.118 |
| 18 | Inv-2 (3.5) | t-BuDPN (10) | B-6 (1) | NPB (7) | 14.51 | 0.128 |

| Sample | $CIE_x$ | $CIE_y$ | Drive Voltage (Volts) | Operational Stability ($t_{1/2}$ in hrs @ 80 mA/cm$^2$) |
|---|---|---|---|---|
| 16 | 0.355 | 0.313 | 8.87 | 384 |
| 17 | 0.386 | 0.361 | 9.22 | 349 |
| 18 | 0.409 | 0.367 | 10.02 | 600 |

[1]Luminance yields and efficiencies reported at 20 mA/cm$^2$.

As can be seen from Tables 4 and 5, Samples 13 through 18 with various yellow and blue dopants show excellent luminance in terms of yields and efficiencies, $CIE_{x,y}$ color co-ordinates, drive voltage and operational stability.

The invention has been described in detail with particular reference to certain preferred embodiments thereof, but it will be understood that variations and modifications can be effected within the spirit and scope of the invention. For example, multiple dopants can be used in any of the hole-transporting, electron-transporting or light-emitting layers.

The patents and other publications referred to are incorporated herein in their entirety.

PARTS LIST

| | |
|---|---|
| 101 | Substrate |
| 103 | Anode |
| 105 | Hole-Injecting layer (HIL) |
| 106 | First Hole-Transporting layer (HTL-1) |
| 107 | Hole-Transporting layer (HTL-1) |
| 108 | Second Hole-Transporting layer (HTL-2) |
| 109 | Light-Emitting layer (LEL) |
| 110 | First Electron-Transporting layer (ETL-1) |
| 111 | Electron-Transporting layer (ETL-1) |
| 112 | Second Electron-Transporting layer (ETL-2) |
| 112b | Third Electron-Transporting layer (ETL-3) |
| 113 | Cathode |

The invention claimed is:

1. An organic light-emitting diode (OLED) device that produces white light, including:
    a) an anode;
    b) a hole-transporting layer disposed over the anode;
    c) a blue light-emitting layer disposed over the hole-transporting layer, wherein the blue-light emitting layer comprises a host material and a blue-light emitting material, wherein the concentration of said blue-light emitting material is in a range of greater than 0 and less than 20% by volume of the host material wherein the blue light emitting material is selected from a bis(azinyl)amine boron complex;
    d) an electron-transporting layer disposed over the blue light-emitting layer;
    e) a cathode disposed over the electron-transporting layer;
    f) wherein the hole-transporting layer comprises an entire layer or a partial portion of a layer in contact with the blue light-emitting layer and contains a light-emitting naphthacene compound having formula (I)

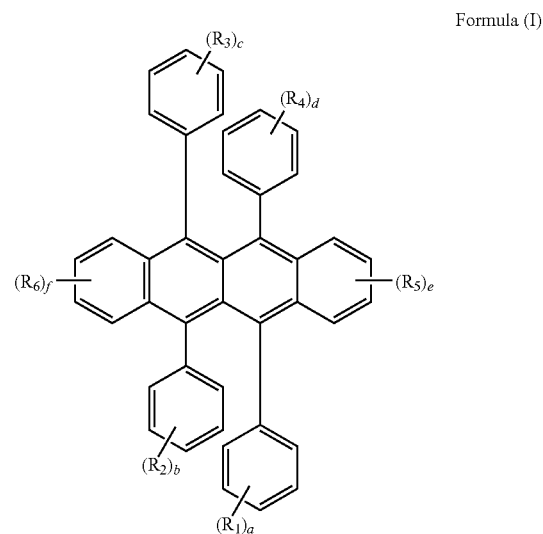

Formula (I)

wherein
  $R_1$, $R_2$, $R_3$, $R_4$, $R_5$ and $R_6$ represent substituents on each ring where each substituent is individually selected from alkyl or substituted alkyl groups of from 1 to 24 carbon atoms; aryl or substituted aryl groups of from 6 to 20 carbon atoms; carbon atoms from 4 to 24 necessary to complete a fused aromatic ring; heterocyclic or substituted heterocyclic groups of from 5 to 24 carbon atoms, which may be bonded via a single bond, or may complete a fused heteroaromatic ring system; alkoxy or aryloxy groups, ailcoxylamino, alkylaniino, and arylamino groups of from 1 to 24 carbon atoms; and fluorine, chlorine, bromine or cyano substituents;
  a, b, c and d are individually selected from 0 through 5;
  e and f are individually selected from 0 through 4;
  provided that not all of a, b, c, d, e, and f are 0;
  provided that at least one of $R_1$ through $R_4$ is not a fused ring group and at least one of $R_1$ through $R_6$ is a substituent; and
  provided further that neither both $R_1$ and $R_4$ nor both $R_2$ and $R_3$ are heterocyclic; and
  wherein the electron-transporting layer is transparent.

2. An organic light-emitting diode (OLED) device that produces white light, including:
    a) an anode;
    b) a hole-transporting layer disposed over the anode;
    c) a blue light-emitting layer disposed over the hole-transporting layer, wherein the blue-light emitting layer comprises a host material and a blue-light emitting material, wherein the concentration of said blue-light emitting material is in a range of greater than 0 and less than 20% by volume of the host material wherein the blue light emitting material is selected from a perylene compound or its derivatives and a bis(azinyl)amine boron complex;
d) an electron-transporting layer disposed over the blue light-emitting layer;
e) a cathode disposed over the electron-transporting layer;
f) wherein the hole-transporting layer comprises an entire layer or a partial portion of a layer in contact with the blue light-emitting layer and contains a light-emitting naplithacene compound having formula (I)

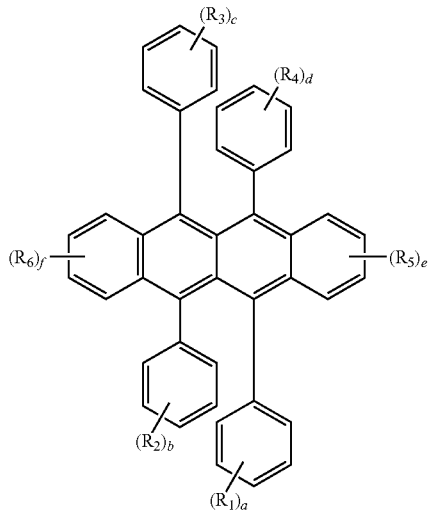

Formula (I)

wherein
$R_1$, $R_2$, $R_3$, $R_4$, $R_5$ and $R_6$ represent substituents on each ring where each substituent is individually selected from alkyl or substituted ailcyl groups of from 1 to 24 carbon atoms; aryl or substituted aryl groups of from 6 to 20 carbon atoms; carbon atoms from 4 to 24 necessary to complete a fused aromatic ring;

heterocyclic or substituted heterocyclic groups of from 5 to 24 carbon atoms, which may be bonded via a single bond, or may complete a fused heteroaromatic ring system; alkoxy or aryloxy groups, alkoxylamino, alkylamino, and arylamino groups of from 1 to 24 carbon atoms; and fluorine, chlorine, bromine or cyano substituents;

a, b, c and d we individually selected from 0 through 5;

e and f are individually selected from 0 through 4;

provided that not all of a, b, c, d, e and f are 0;

provided that at least one of $R_1$ through $R_4$ is not a fused ring group and at least one of $R_1$ through $R_6$ is a substituent; and provided further that neither both $R_1$ and $R_4$ nor both $R_2$ and $R_3$ are heterocyclic;

wherein the hole-transporting layer and the blue-light emitting layers comprise hosts and emitting dopants and are co-doped with other dopants; and wherein the co-dopant in the hole-transporting layer is t-BuDPN and the co-dopant in the blue-light emitting layer is NPB.

* * * * *